US010784312B1

(12) United States Patent
Kabuyanagi et al.

(10) Patent No.: US 10,784,312 B1
(45) Date of Patent: Sep. 22, 2020

(54) SEMICONDUCTOR MEMORY DEVICE

(71) Applicant: TOSHIBA MEMORY CORPORATION, Minato-ku, Tokyo (JP)

(72) Inventors: Shoichi Kabuyanagi, Kawasaki Kanagawa (JP); Shosuke Fujii, Kuwana Mei (JP); Masumi Saitoh, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/564,667

(22) Filed: Sep. 9, 2019

(30) Foreign Application Priority Data

Mar. 20, 2019 (JP) ................................. 2019-052541

(51) Int. Cl.
*H01L 27/24* (2006.01)
*G11C 13/00* (2006.01)
*H01L 45/00* (2006.01)

(52) U.S. Cl.
CPC ........ *H01L 27/2454* (2013.01); *G11C 13/003* (2013.01); *G11C 13/0007* (2013.01); *H01L 27/249* (2013.01); *G11C 2213/32* (2013.01); *G11C 2213/71* (2013.01); *G11C 2213/79* (2013.01); *H01L 45/08* (2013.01); *H01L 45/1226* (2013.01)

(58) Field of Classification Search
CPC ............... H01L 27/2454; H01L 27/249; H01L 45/1226; H01L 45/08; G11C 13/003; G11C 13/0007; G11C 2213/79; G11C 2213/32; G11C 2213/71
See application file for complete search history.

(56) References Cited

U.S. PATENT DOCUMENTS

| | | | |
|---|---|---|---|
| 7,821,058 B2 | 10/2010 | Kidoh et al. | |
| 7,952,136 B2 | 5/2011 | Kito et al. | |
| 9,053,977 B2 | 6/2015 | Choi et al. | |
| 9,275,729 B2 | 3/2016 | Ota et al. | |
| 9,595,535 B1 | 3/2017 | Ogawa et al. | |

(Continued)

FOREIGN PATENT DOCUMENTS

| | | |
|---|---|---|
| JP | 2008-171918 A | 7/2008 |
| JP | 2015-056642 A | 3/2015 |

(Continued)

*Primary Examiner* — Ajay Ojha
(74) *Attorney, Agent, or Firm* — Foley & Lardner LLP

(57) ABSTRACT

A semiconductor memory device includes a first wiring extending in a first direction, a second wiring extending in a second direction, a variable resistance film provided between these, a third wiring extending in a third direction, a first semiconductor section connected to the first wiring and the third wiring, a first gate electrode facing the first semiconductor section, a contact connected to the second wiring, a fourth wiring further from the substrate than the contact is, a second semiconductor section connected to the contact and the fourth wiring, and a second gate electrode facing the second semiconductor section. The first semiconductor section, the first gate electrode, the second semiconductor section, and the second gate electrode respectively include a portion included in a cross section extending in the second direction and the third direction.

16 Claims, 22 Drawing Sheets

(56) References Cited

U.S. PATENT DOCUMENTS

| | | | |
|---|---|---|---|
| 9,818,757 B2 | 11/2017 | Ikeda et al. | |
| 10,038,032 B2 | 7/2018 | Sakuma et al. | |
| 2015/0076579 A1 | 3/2015 | Tsuji et al. | |
| 2016/0351628 A1* | 12/2016 | Okajima | H01L 27/11565 |
| 2017/0271586 A1 | 9/2017 | Tanaka et al. | |
| 2018/0076264 A1* | 3/2018 | Sasaki | H01L 27/249 |

FOREIGN PATENT DOCUMENTS

| | | |
|---|---|---|
| JP | 2016-171221 A | 9/2016 |
| JP | 2017-059607 A | 3/2017 |
| JP | 6524006 B2 | 6/2019 |

* cited by examiner

US 10,784,312 B1

SEMICONDUCTOR MEMORY DEVICE

CROSS-REFERENCE TO RELATED APPLICATIONS

This application is based upon and claims the benefit of Japanese Patent Application No. 2019-052541, filed on Mar. 20, 2019, the entire contents of which are incorporated herein by reference.

FIELD

The present embodiment relates to a semiconductor memory device.

BACKGROUND

Description of the Related Art

The increasing level of integration of semiconductor memory devices is leading to advances in development of semiconductor memory devices in which memory cells are disposed three-dimensionally. Among such semiconductor memory devices, there are known the likes of, for example, a so-called ReRAM (Resistive Random Access Memory) that utilizes as a memory cell a variable resistance element whose resistance value is reversibly changed, or a so-called flash memory that utilizes as a memory cell a field effect transistor capable of accumulating a charge in its gate insulating layer.

DETAILED DESCRIPTION

Figure 1:
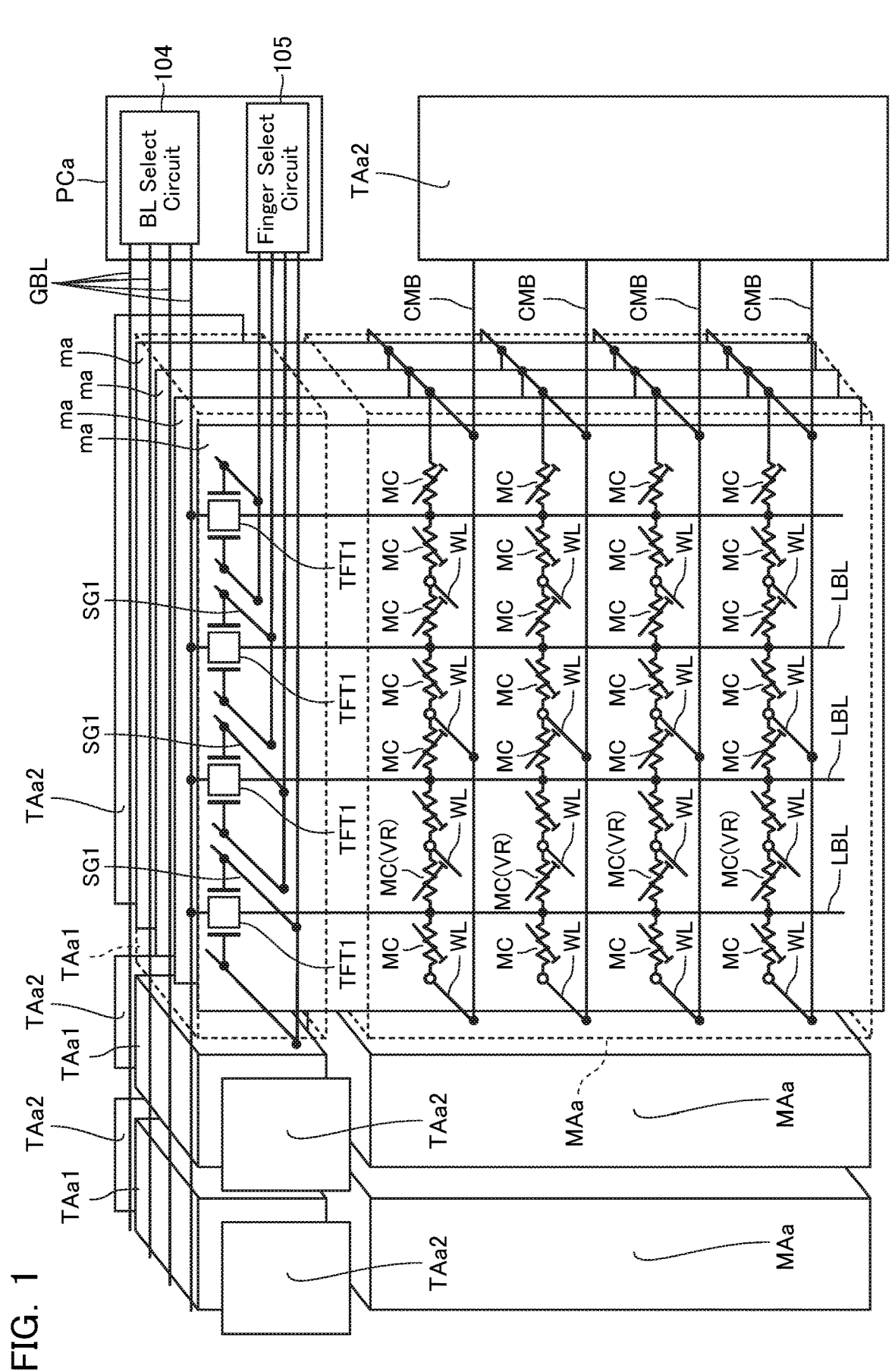
FIG. 1 is a schematic circuit diagram showing a configuration of part of a semiconductor memory device according to a first embodiment.

A semiconductor memory device according to an embodiment includes: a substrate; a first wiring that extends in a first direction intersecting a surface of the substrate; a second wiring that extends in a second direction intersecting the first direction; a variable resistance film provided between the first wiring and the second wiring; a third wiring that extends in a third direction intersecting the first direction and the second direction, and is further from the substrate than the first wiring is; a first semiconductor section that extends in the first direction and is connected to the first wiring and the third wiring; a first gate electrode facing the first semiconductor section; a first gate insulating film provided between the first semiconductor section and the first gate electrode; a contact that extends in the first direction and is connected to the second wiring; a fourth wiring that is further from the substrate than the contact is; a second semiconductor section that extends in the first direction and is connected to the contact and the fourth wiring; a second gate electrode facing the second semiconductor section; and a second gate insulating film provided between the second semiconductor section and the second gate electrode. The first semiconductor section, the first gate electrode, the first gate insulating film, the second semiconductor section, the second gate electrode, and the second gate insulating film respectively include a portion included in a first cross section extending in the second direction and the third direction.

A semiconductor memory device according to an embodiment includes: a substrate; a first wiring that extends in a first direction intersecting a surface of the substrate; a second wiring that extends in a second direction intersecting the first direction; a variable resistance film provided between the first wiring and the second wiring; a third wiring that extends in a third direction intersecting the first direction and the second direction, and is separated from the first wiring in the first direction; a first semiconductor section that extends in the first direction and is connected to the first wiring and the third wiring; a first gate electrode facing the first semiconductor section; a first gate insulating film provided between the first semiconductor section and the first gate electrode; a contact that extends in the first direction and is connected to the second wiring; a fourth wiring that is separated from the contact in the first direction; a second semiconductor section and a third semiconductor section that extend in the first direction and are connected in series between the contact and the fourth wiring; a second gate electrode facing the second semiconductor section; a second gate insulating film provided between the second semiconductor section and the second gate electrode; a third gate electrode facing the third semiconductor section; and a third gate insulating film provided between the third semiconductor section and the third gate electrode. The second gate electrode extends in one of the second direction and the third direction, and the third gate electrode extends in the other of the second direction and the third direction.

Next, semiconductor memory devices according to embodiments will be described in detail with reference to the drawings. Note that the drawings below are schematic, and that a specific configuration may be appropriately adjusted. Moreover, for purposes of explanation, the drawings below will sometimes omit part of the configuration. Moreover, the embodiments below are merely examples, and are not shown with the intention of limiting the present invention. Moreover, in the description below, basically, portions similar for a plurality of embodiments will not be repeatedly described.

Moreover, in the present specification, a certain direction parallel to a surface of a substrate will be called an X direction, a direction parallel to the surface of the substrate and perpendicular to the X direction will be called a Y direction, and a direction perpendicular to the surface of the substrate will be called a Z direction.

Moreover, in the present specification, sometimes, a direction along a certain plane will be called a first direction, a direction intersecting the first direction along this certain plane will be called a second direction, and a direction intersecting this certain plane will be called a third direction. These first direction, second direction, and third direction may, but need not, each respectively correspond to any one of the X direction, the Y direction, and the Z direction.

Moreover, in the present specification, expressions such as "up" or "down" will be defined with reference to the substrate. For example, an orientation of moving away from the substrate along the above-described Z direction will be called up, and an orientation of coming closer to the substrate along the Z direction will be called down. Moreover, when a lower surface or a lower end is referred to for a certain configuration, this will be assumed to mean a surface or end section on a substrate side of this configuration, and when an upper surface or an upper end is referred to for a certain configuration, this will be assumed to mean a surface or end section on an opposite side to the substrate of this configuration. Moreover, a surface intersecting the X direction or the Y direction will be called a side surface, and so on.

Moreover, in the present specification, when a first configuration is said to be "electrically connected" to a second configuration, the first configuration may be connected to the second configuration directly, or the first configuration may be connected to the second configuration via the likes of a wiring, a semiconductor member, or a transistor. For example, even when, in the case of three transistors having been connected in series, the second transistor is in an OFF state, the first transistor is "electrically connected" to the third transistor.

Moreover, in the present specification, when a first configuration is said to be "connected between" a second configuration and a third configuration, this will sometimes mean that the first configuration, the second configuration, and the third configuration are connected in series, and the first configuration is provided in a current path of the second configuration and the third configuration.

Moreover, in the present specification, when a circuit, or the like, is said to "electrically conduct" two wirings, or the like, this will sometimes mean, for example, that this circuit, or the like, includes a transistor, or the like, that this transistor, or the like, is provided in a current path between the two wirings, and that this transistor, or the like, is in an ON state.

First Embodiment

[Circuit Configuration]

Figure 2:
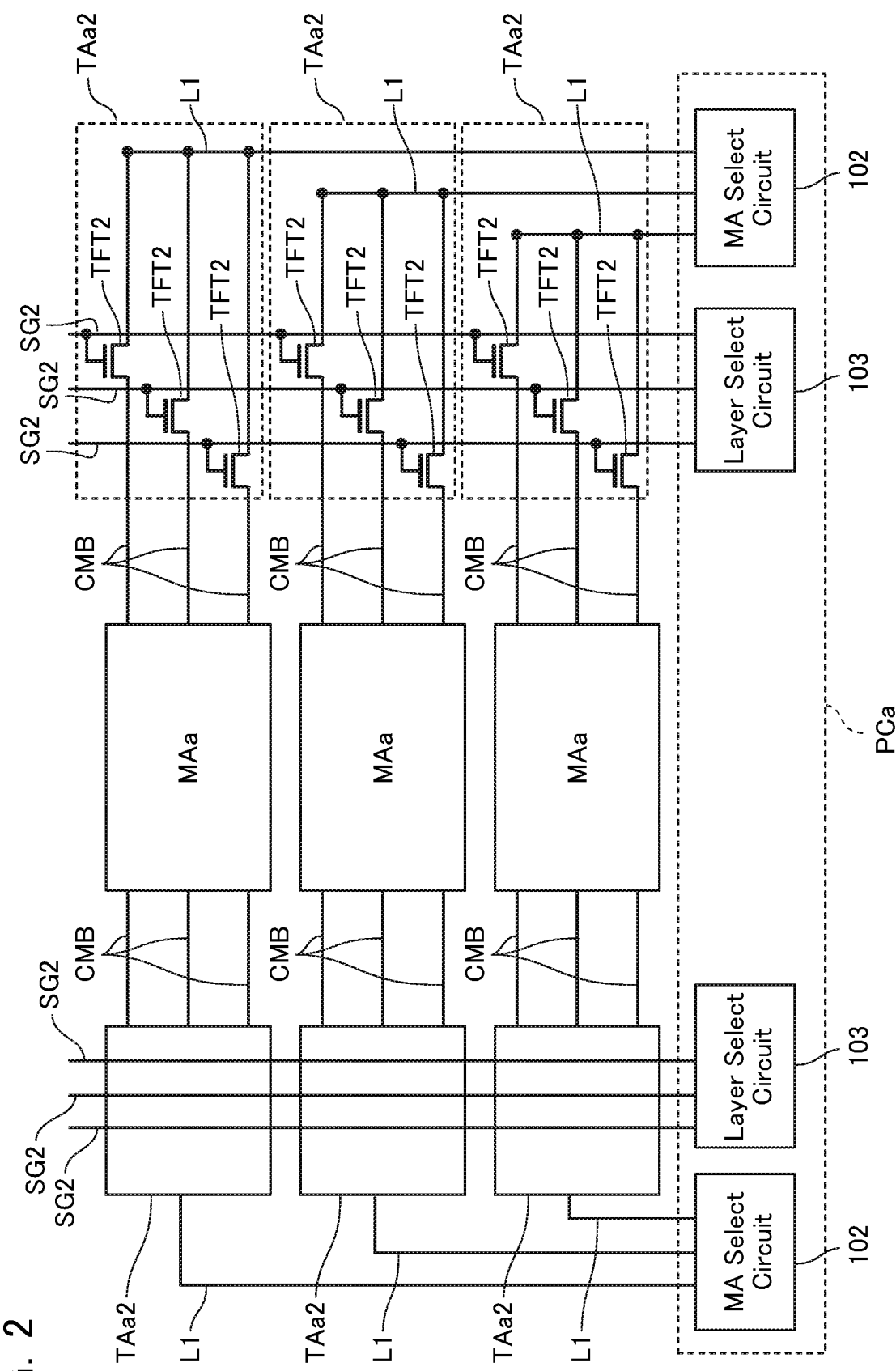
FIG. 2 is a schematic circuit diagram showing a configuration of part of same semiconductor memory device.

Next, a circuit configuration of a semiconductor memory device according to a first embodiment will be described with reference to FIGS. 1 and 2. FIGS. 1 and 2 are schematic circuit diagrams of the semiconductor memory device according to the first embodiment.

As shown in FIG. 1, for example, the semiconductor memory device according to the present embodiment includes: a plurality of memory cell arrays MAa that store data; a plurality of transistor arrays TAa1 respectively connected to the memory cell arrays MAa; a plurality of transistor arrays TAa2 respectively connected to the memory cell arrays MAa; and a peripheral circuit PCa that controls these.

FIG. 1 illustrates a plurality of circuit elements ma. These plurality of circuit elements ma each include: part of a configuration of the memory cell array MAa; part of a configuration of the transistor array TAa1; and a global bit line GBL.

That is, the circuit element ma includes the following that configure part of the memory cell array MAa, namely: a plurality of word lines WL; a plurality of local bit lines LBL; and a plurality of memory cells MC connected to these plurality of word lines WL and plurality of local bit lines LBL. The plurality of word lines WL are each connected to all of the memory elements ma. Moreover, the plurality of word lines WL are each connected to the transistor array TAa2 via a wiring CMB. The memory cell MC is a two-terminal variable resistance element storing one or more bits of data, for example.

Moreover, the circuit element ma includes the following that configure part of the transistor array TAa1, namely: a plurality of transistors TFT1; and a plurality of select gate lines SG1. The transistor TFT1 is a field effect type of transistor. A drain electrode of the transistor TFT1 is connected to the global bit line GBL, and its source electrode is connected to the local bit line LBL. Its gate electrode is connected to the select gate line SG1. The plurality of select gate lines SG1 are each connected to all of the circuit elements ma.

As exemplified in FIG. 2, for example, the transistor array TAa2 includes: a plurality of transistors TFT2 respectively connected to a plurality of the wirings CMB; and a plurality of select gate lines SG2 provided correspondingly to these plurality of transistors TFT2. The transistor TFT2 is a field effect type of transistor. A drain electrode of the transistor TFT2 is connected to the wiring CMB, and its source electrode is connected to a wiring L1. Its gate electrode is connected to the select gate line SG2. The wiring L1 is provided independently to each transistor array TAa2. The plurality of select gate lines SG2 are each connected to the plurality of transistor arrays TAa2.

Moreover, the peripheral circuit PCa includes: a memory cell array select circuit 102 (FIG. 2); a layer select circuit 103 (FIG. 2); a bit line select circuit 104 (FIG. 1); and a finger select circuit 105 (FIG. 1).

As shown in FIG. 2, the memory cell array select circuit 102 is connected to the wirings L1. The memory cell array select circuit 102 selectively transfers a voltage to one of the plurality of memory cell arrays MAa. For example, the memory cell array select circuit 102 selects one wiring L1 from a plurality of the wirings L1 according to address data, and electrically conducts the selected wiring L1 with a certain voltage supply line. Note that the memory cell array select circuit 102 may electrically conduct the other wirings L1 with another voltage supply line, or may make the other wirings L1 in a floating state.

The layer select circuit 103 is connected to the select gate line SG2. The layer select circuit 103 selectively supplies a voltage to one of the plurality of word lines WL laminated in the Z direction (refer to FIGS. 4 and 5). For example, the layer select circuit 103 selects one select gate line SG2 from the plurality of select gate lines SG2 according to address data, and electrically conducts the selected select gate line SG2 with a certain voltage supply line. Note that the layer select circuit 103 may electrically conduct the other select gate lines SG2 with another voltage supply line, or may make the other select gate lines SG2 in a floating state.

As shown in FIG. 1, the bit line select circuit 104 is connected to the global bit lines GBL. The bit line select circuit 104 selects one global bit line GBL from a plurality of the global bit lines GBL according to address data, and electrically conducts the selected global bit line GBL with a certain voltage supply line. Note that the bit line select circuit 104 may electrically conduct the other global bit lines GBL with another voltage supply line, or may make the other global bit lines GBL in a floating state.

The finger select circuit 105 is connected to the select gate lines SG1. The finger select circuit 105 selects one select gate line SG1 from the plurality of select gate lines SG1 according to address data, and electrically conducts the selected select gate line SG1 with a certain voltage supply line. Note that the finger select circuit 105 may electrically conduct the other select gate lines SG1 with another voltage supply line, or may make the other select gate lines SG1 in a floating state.

In addition, the peripheral circuit PCa includes the likes of a voltage adjusting circuit, a sense amplifier circuit, and a sequencer controlling these. The voltage adjusting circuit steps down a power supply voltage, or the like, as required, and outputs the stepped-down power supply voltage, or the like, to voltage supply lines. The sense amplifier circuit outputs data of 0 or 1 depending on a voltage or current of the global bit line GBL, for example.

Configuration Example

Figure 3:
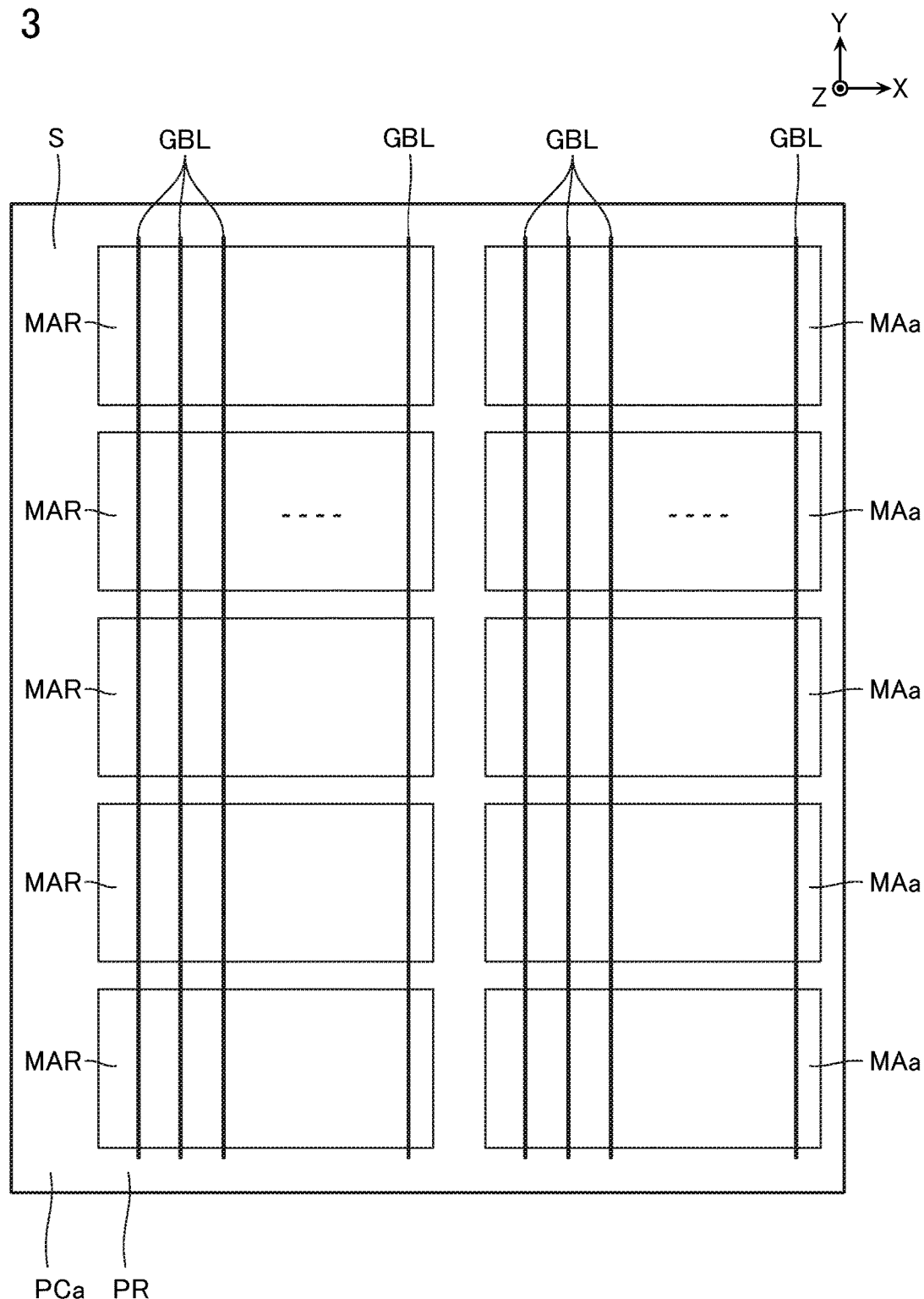
FIG. 3 is a schematic plan view showing a configuration example of same semiconductor memory device.
Figure 4:
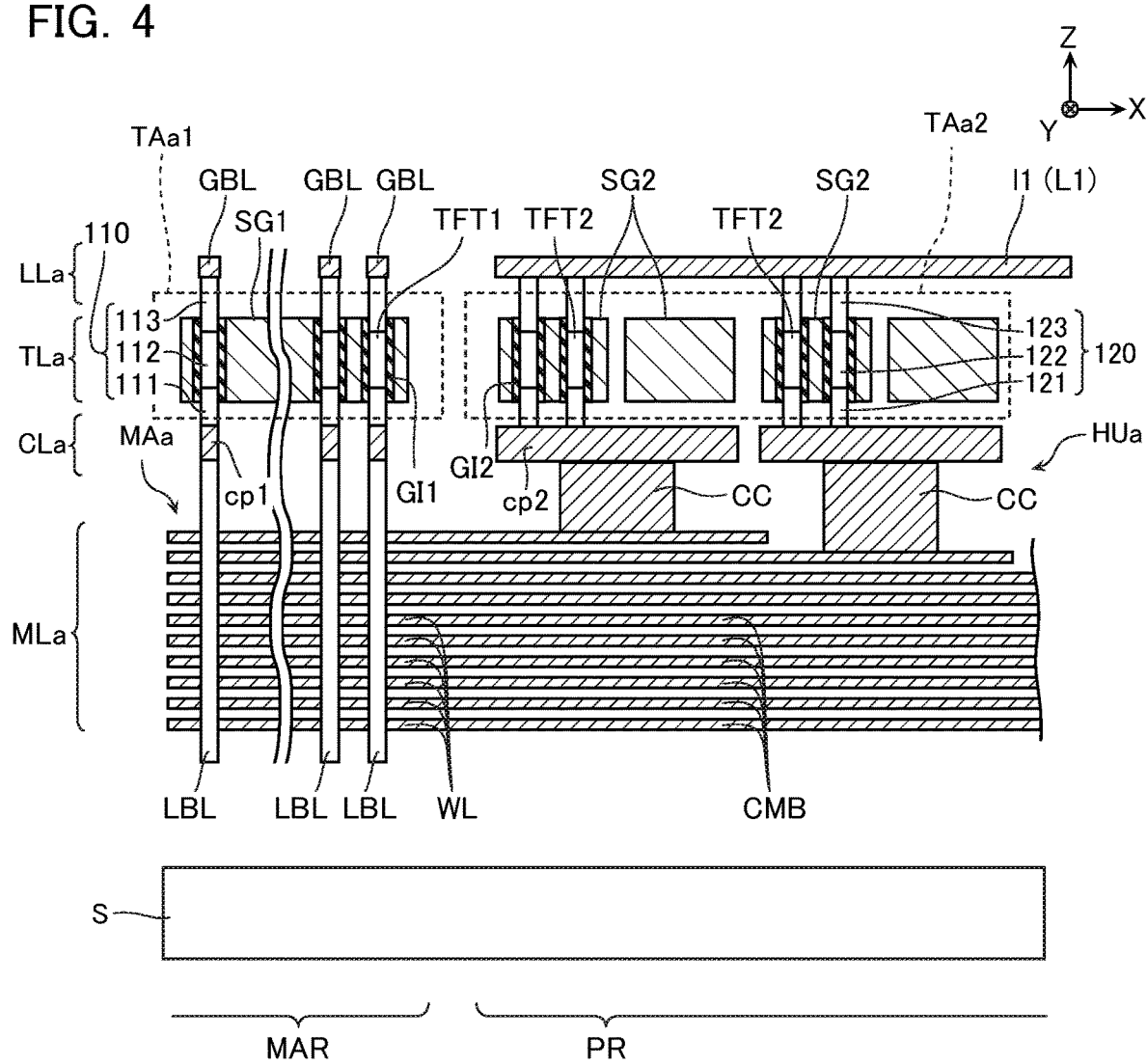
FIG. 4 is a schematic view showing a configuration of part of same configuration example.

Next, a configuration example of the semiconductor memory device according to the present embodiment will be described with reference to FIGS. 3 and 4. FIG. 3 is a schematic plan view showing the configuration example of the semiconductor memory device according to the present embodiment. FIG. 4 is a schematic view showing the configuration example of the semiconductor memory device according to the present embodiment.

As shown in FIG. 3, the semiconductor memory device according to the present embodiment includes: a substrate S; and a plurality of the memory cell arrays MAa that are provided on the substrate S and are arranged in the X direction and the Y direction. Note that in the example of FIG. 3, a plurality of the global bit lines GBL are commonly connected to a plurality of the memory cell arrays MAa arranged in the Y direction.

Hereafter, a region where the memory cell array MAa is provided will sometimes be called a memory cell array region MAR. Moreover, a region on an outer side of the memory cell array region MAR will sometimes be called a peripheral region PR.

As shown in FIG. 4, the semiconductor memory device according to the present embodiment includes: a memory layer MLa provided above the substrate S; a connection layer CLa provided above the memory layer MLa; a transistor layer TLa provided above the connection layer CLa; and a wiring layer LLa provided above the transistor layer TLa.

The memory layer MLa includes: the memory cell array MAa provided in the memory cell array region MAR; and a hookup HUa provided in the peripheral region PR.

The connection layer CLa includes: a plurality of connecting sections cp1 that connect the memory cell array MAa and the transistor array TAa1; and a plurality of connecting sections cp2 that connect the hookup HUa and the transistor array TAa2.

The transistor layer TLa includes: the transistor array TAa1 provided in the memory cell array region MAR; and the transistor array TAa2 provided in the peripheral region PR.

The wiring layer LLa includes: the global bit line GBL provided in the memory cell array region MAR; and the wiring L1 provided in the peripheral region PR.

[Memory Cell Array MAa]

Figure 5:
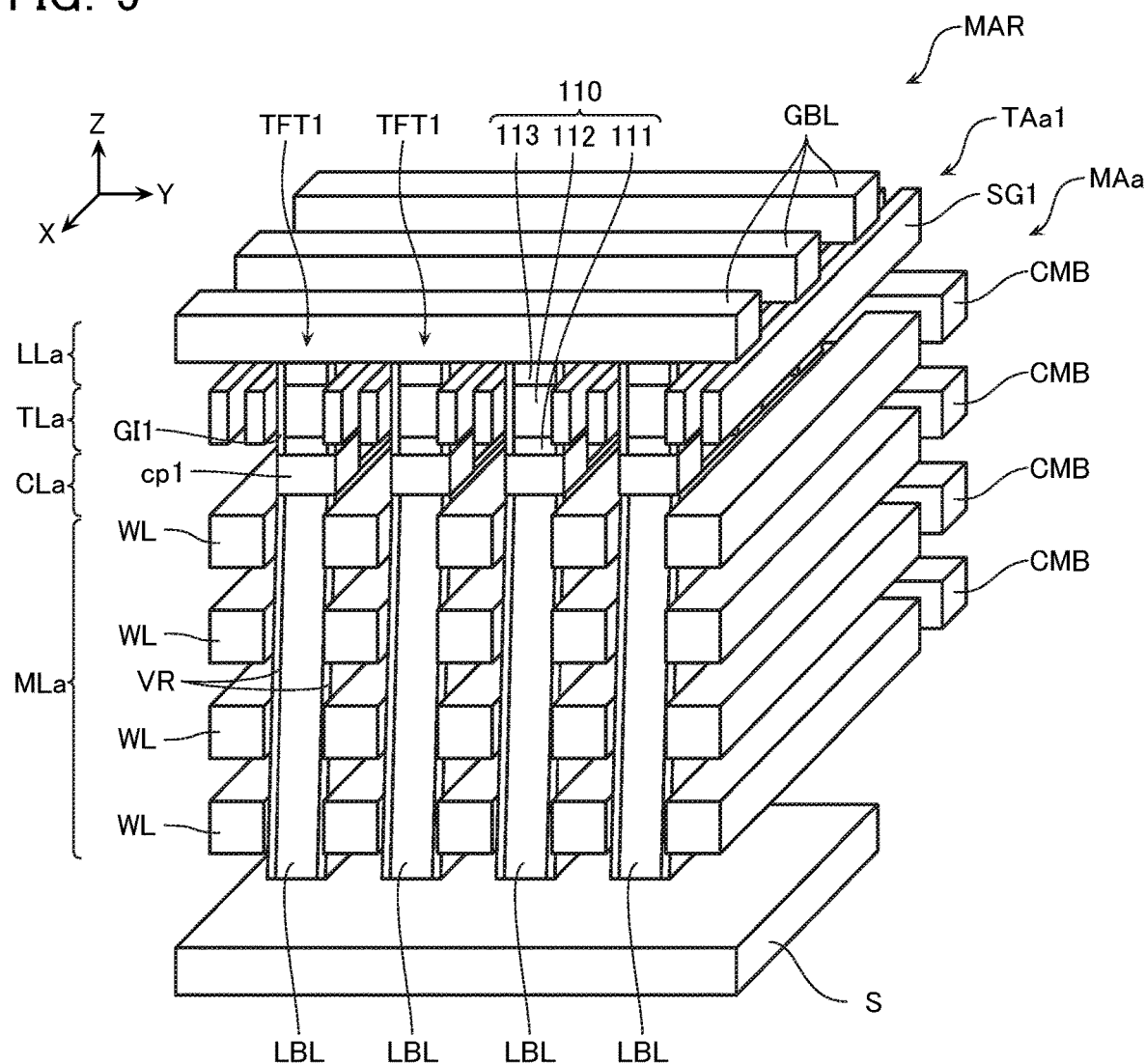
FIG. 5 is a schematic perspective view showing a configuration of part of same configuration example.

FIG. 5 is a schematic perspective view showing part of the semiconductor memory device according to the present embodiment.

The memory cell array MAa includes: a plurality of the word lines WL arranged in the Y direction and the Z direction, and extending in the X direction; a plurality of the local bit lines LBL arranged in the X direction and the Y direction, and extending in the Z direction; and a plurality of variable resistance films VR respectively provided between the word lines WL and the local bit lines LBL.

The word line WL and the local bit line LBL may include a laminated film of titanium nitride (TiN) and tungsten (W), or may include the likes of polycrystalline silicon (p-Si) implanted with an impurity, or a silicide, for example. An unillustrated insulating layer of the likes of $SiO_2$ may be provided between these wirings.

The variable resistance film VR may include a metal oxide of the likes of hafnium oxide ($HfO_x$), aluminum oxide ($AlO_x$), titanium oxide ($TiO_x$), or zirconium oxide ($ZrO_x$), or may include the likes of a laminated film of these, for example.

[Connecting Section Cp1]

The connecting sections cp1 are arranged in the X direction and the Y direction correspondingly to the local bit lines LBL, and are connected to the local bit lines LBL.

Note that the connecting section cp1 may include the likes of a material applicable to the word line WL and the local bit line LBL, for example. Moreover, an unillustrated insulating layer of the likes of $SiO_2$ may be provided between these connecting sections cp1.

[Transistor Array TAa1]

The transistor array TAa1 includes: a plurality of the transistors TFT1; and a plurality of the select gate lines SG1.

The transistors TFT1 are arranged in the X direction and the Y direction correspondingly to the local bit lines LBL, and are connected to the local bit lines LBL via the connecting sections cp1. The transistor TFT1 includes: a semiconductor section 110; a gate insulating film GI1 of the likes of $SiO_2$, provided between the semiconductor section 110 and the select gate line SG1; and part of the select gate line SG1. The semiconductor section 110 includes the likes of polycrystalline silicon (Si), for example. Moreover, the semiconductor section 110 includes: an n type impurity region 111 connected to the connecting section cp1; a p type impurity region 112 provided above the n type impurity region 111; and an n type impurity region 113 provided above the p type impurity region 112.

The select gate lines SG1 are arranged in the Y direction correspondingly to the transistors TFT1, and extend in the X direction. The select gate line SG1 faces the p type impurity regions 112 of a plurality of the transistors TFT1 arranged in the X direction. The select gate line SG1 functions as the gate electrode of the transistor TFT1. A shape, and so on, of the select gate line SG1 may be appropriately adjusted. For example, the select gate line SG1 may have a plurality of through-holes respectively facing outer peripheral surfaces of a plurality of the semiconductor sections 110. Moreover, the select gate line SG1 may include two wiring members respectively facing side surfaces on one side and the other side in the Y direction of the semiconductor section 110.

Note that the select gate line SG1 may include the likes of a material applicable to the word line WL and the local bit line LBL, for example. Moreover, an unillustrated insulating layer of the likes of $SiO_2$ may be provided between these configurations.

[Global Bit Line GBL]

The global bit lines GBL are arranged in the X direction correspondingly to the transistors TFT1, and extend in the Y direction. The global bit line GBL is commonly connected to a plurality of the transistors TFT1 aligned in the Y direction. Note that the global bit line GBL may include the likes of a material applicable to the word line WL and the local bit line LBL, for example. Moreover, an unillustrated insulating layer of the likes of $SiO_2$ may be provided between these wirings.

[Hookup HUa]

As exemplified in FIG. 4, the hookup HUa includes: a plurality of the wirings CMB laminated in the Z direction; and a plurality of contacts CC that extend in the Z direction and are connected to these plurality of wirings CMB.

The plurality of wirings CMB are respectively provided in the same wiring layers as the plurality of word lines WL laminated in the Z direction. As exemplified in FIG. 6, for example, the wiring CMB is connected to a plurality of the word lines WL aligned in the Y direction, and, together with the plurality of word lines WL, configures a comb-shaped wiring. A plurality of the local bit lines LBL aligned in the X direction are provided between the word lines WL connected to the wiring CMB disposed on one side in the X direction (for example, the right side in FIG. 6) and the word lines WL connected to the wiring CMB disposed on the other side in the X direction (for example, the left side in FIG. 6).

Figure 6:
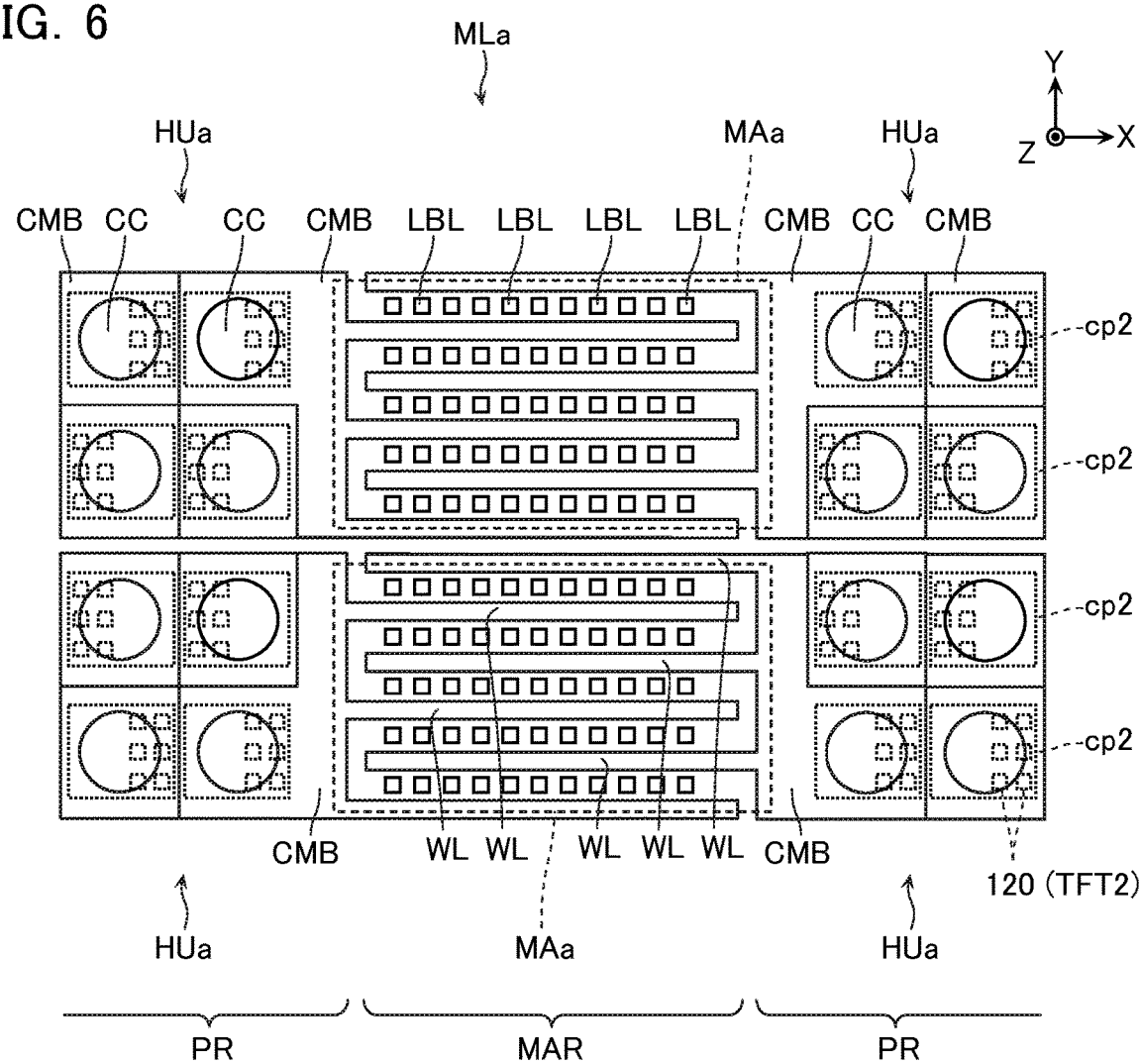
FIG. 6 is a schematic plan view showing a configuration of part of same configuration example.

A plurality of the contacts CC are provided correspondingly to a plurality of the wirings CMB laminated in the Z direction. Heights of lower ends of these plurality of contacts CC differ from each other. A width in the X direction and the Y direction of the contact CC is larger than a width in the X direction and the Y direction of the local bit line LBL. Placement, and so on, of the contact CC may be appropriately changed. In the example of FIG. 6, the plurality of contacts CC corresponding to one memory cell array MAa are arranged over two columns. That is, a column of the contacts CC is formed by a plurality of the contacts CC aligned in the X direction, and two of these columns are aligned in the Y direction. However, the contacts CC may be arranged in one column in the X direction, may be arranged over three or more columns, or may be arranged in another mode.

Note that the wiring CMB includes the likes of a material included in the word line WL, for example. The contact CC may include the likes of a material applicable to the word line WL and the local bit line LBL, for example. Moreover, an unillustrated insulating layer of the likes of $SiO_2$ may be provided between these wirings.

[Connecting Section Cp2]

The connecting sections cp2 are arranged in the X direction and the Y direction correspondingly to the contacts CC, and are connected to the contacts CC. The connecting section cp2 may be formed in substantially a rectangular shape in an XY cross section, for example. Moreover, a width in the X direction and the Y direction of the connecting section cp2 may be of the same degree as, or may be larger than the width in the X direction and the Y direction of the contact CC.

Note that the connecting section cp2 includes the likes of a material included in the connecting section cp1, for example. Moreover, an unillustrated insulating layer of the likes of $SiO_2$ may be provided between these connecting sections cp2.

[Transistor Array TAa2]

Figure 7:
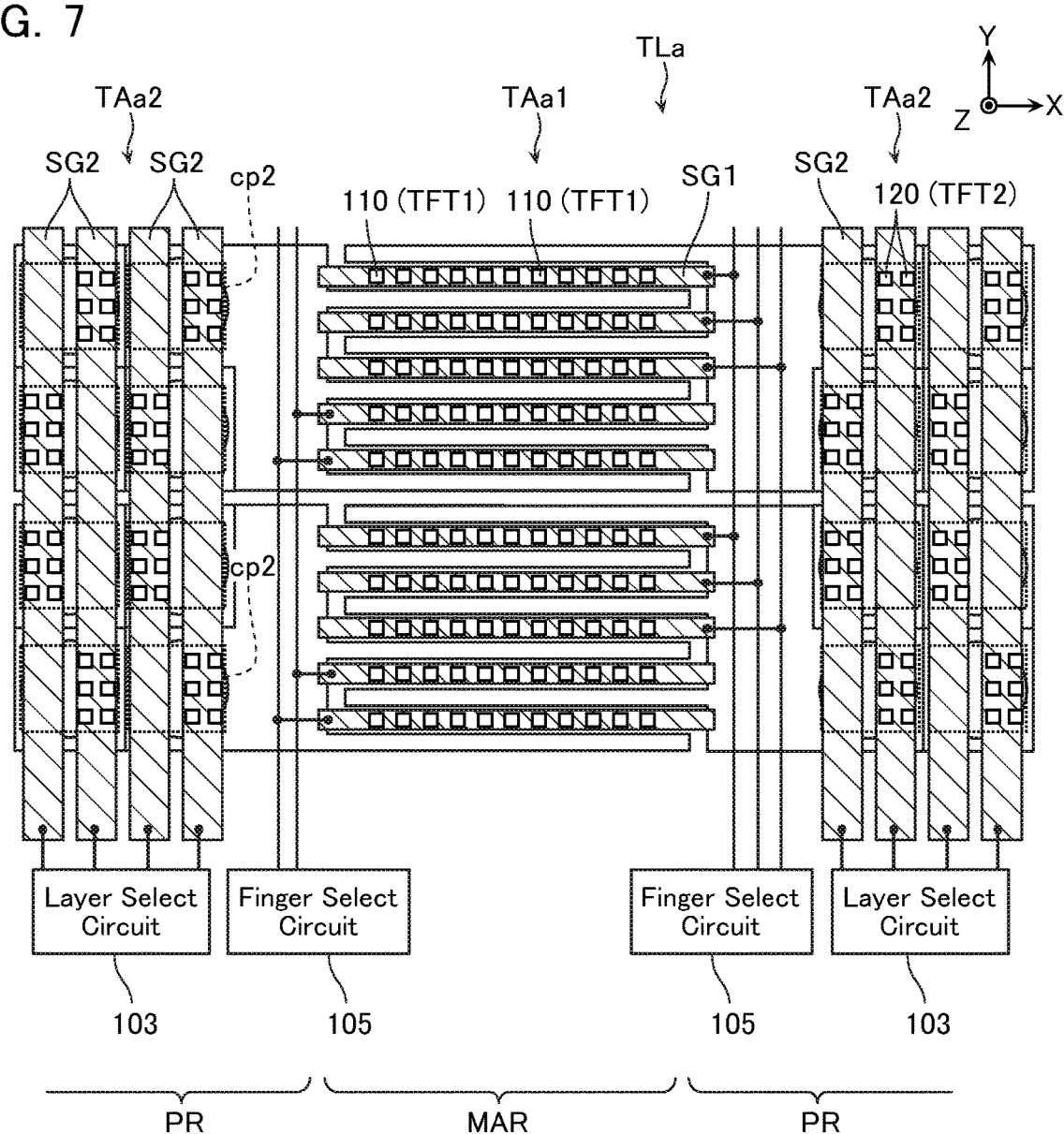
FIG. 7 is a schematic plan view showing a configuration of part of same configuration example.

As exemplified in FIG. 7, for example, the transistor array TAa2 includes: a plurality of the transistors TFT2; and a plurality of the select gates SG2.

An XY cross section exemplified in FIG. 7 includes portions of the semiconductor sections 110 of the plurality of the transistors TFT1, portions of the select gate lines SG1, and portions of gate insulating films GI1 (FIG. 4) provided between them. Additionally, the XY cross section includes portions of semiconductor sections 120 of the plurality of the transistors TFT2, portions of the select gate lines SG2, and portions of gate insulating films GI2 (FIG. 4) provided between them.

A plurality of the transistors TFT2 are arranged in the X direction and the Y direction correspondingly to one contact CC, and the transistors TFT2 are connected in parallel to the contact CC via the connecting sections cp2. As exemplified in FIG. 4, for example, the transistor TFT2 includes: a semiconductor section 120; a gate insulating film GI2 of the likes of $SiO_2$, provided between the semiconductor section 120 and the select gate line SG2; and part of the select gate line SG2. The semiconductor section 120 includes the likes of polycrystalline silicon (Si), for example. Moreover, the semiconductor section 120 includes: an n type impurity region 121 connected to the connecting section cp2; a p type impurity region 122 provided above the n type impurity region 121; and an n type impurity region 123 provided above the p type impurity region 122.

Figure 9:
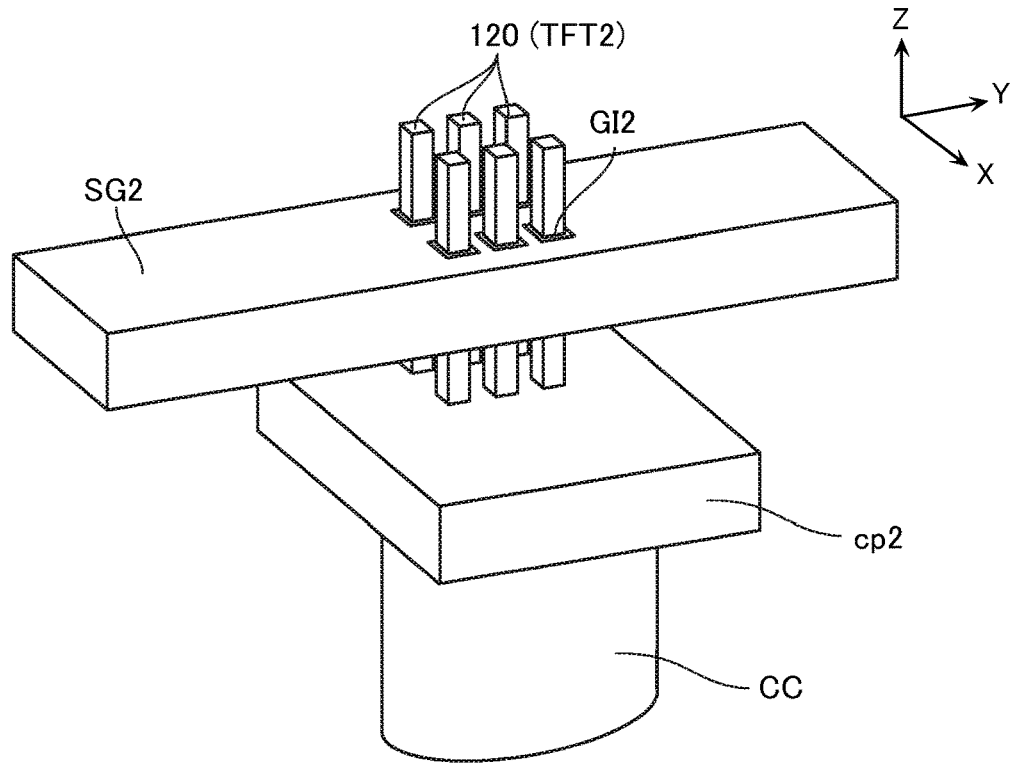
FIG. 9 is a schematic perspective view showing a configuration of part of same configuration example.
Figure 10:
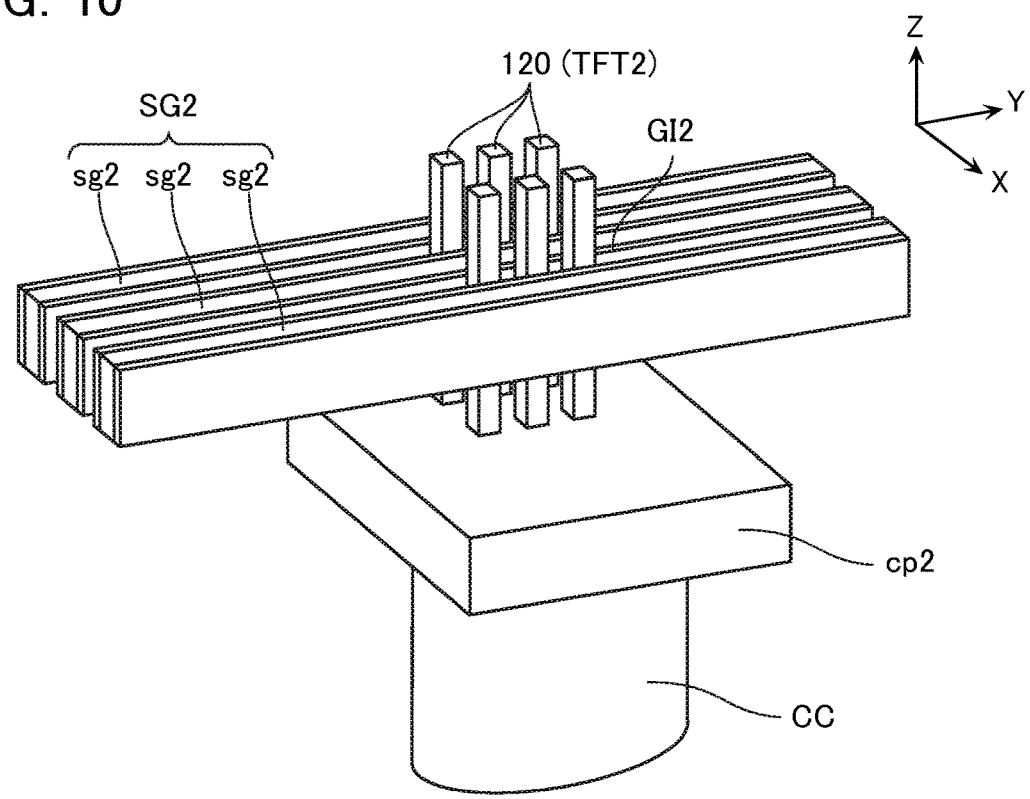
FIG. 10 is a schematic perspective view showing a configuration of part of same configuration example.

As exemplified in FIG. 7, for example, the select gate lines SG2 are arranged in the X direction correspondingly to the contacts CC, and extend in the Y direction. The select gate line SG2 faces the p type impurity region 122 of the semiconductor section 120. Moreover, as exemplified in FIG. 9, for example, the select gate line SG2 faces side surfaces of a plurality of the semiconductor sections 120 arranged in the X direction and the Y direction. As a result, the select gate line SG2 functions as a common gate electrode of the plurality of transistors TFT2. A shape, and so on, of the select gate line SG2 may be appropriately adjusted. As exemplified in FIG. 9, for example, the select gate line SG2 may have a plurality of through-holes respectively facing outer peripheral surfaces of a plurality of the semiconductor sections 120. Moreover, as exemplified in FIG. 10, for example, the select gate line SG2 may include a plurality of wiring members sg2 respectively facing side surfaces on one side and the other side in the X direction of the semiconductor section 120.

Note that in the example of FIG. 7, two select gate lines SG2 are provided correspondingly to a plurality of the contacts CC aligned in the Y direction. Moreover, a plurality of the semiconductor sections 120 are arranged in the X direction and the Y direction in a region where the connecting section cp2 and the select gate line SG2 corresponding to one contact CC overlap, when viewed from the Z direction. An arrangement cycle in the X direction and the Y direction of the semiconductor sections 120 in this region may be of the same as an arrangement cycle in the X direction of the plurality of semiconductor sections 110 provided in the memory cell array region MAR, for example.

Note that, even if the arrangement cycle in the X direction or the Y direction of the semiconductor sections 120 is not the same as the arrangement cycle in the X direction of the semiconductor sections 110 strictly, if the difference between these arrangement cycles are within margin of manufacturing error, these arrangement cycles are the same.

Additionally, the arrangement cycles can be measured by various methods. For example, an image including at least one of the plurality of the semiconductor sections 110 and the plurality of the semiconductor sections 120 is acquired by using SEM (Scanning Electron Microscope), TEM (Transmission Electron Microscope) or the like. Next, a line is set in the acquired image so as to overlap the plurality of semiconductor sections TFT1 or the plurality of semiconductor sections TFT2. For example, if the arrangement cycle in the X direction is acquired, the line extends in the X direction. Next, illuminance values of pixels configuring the set line are acquired, and a graph showing positions of the pixels as a horizontal axis and illuminance values of the pixels as a vertical axis is acquired. Next, fitting using periodic function such as square wave, sine wave or the like is performed to the graph. In the fitting, period of the periodical function is fitted to the illuminance values of the pixels. The fitted period can be acquired as the arrangement cycle of the semiconductor sections 110 or the semiconductor sections 120.

The select gate line SG2 includes the likes of a material included in the select gate line SG1, for example. Moreover, an unillustrated insulating layer of the likes of $SiO_2$ may be provided between these wirings.

[Wiring L1]

Figure 8:
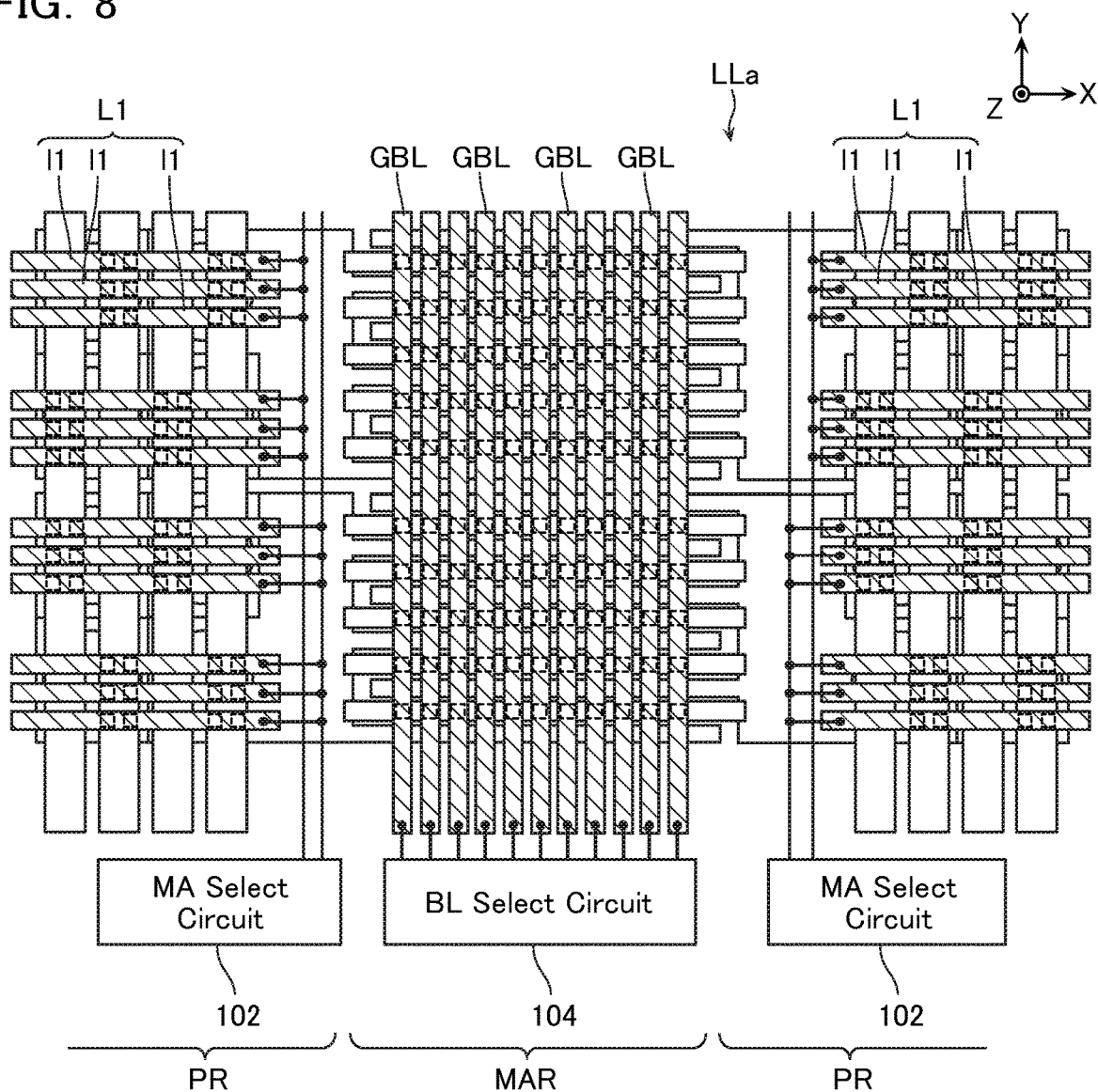
FIG. 8 is a schematic plan view showing a configuration of part of same configuration example.

As exemplified in FIG. 8, for example, the wiring L1 includes a plurality of wirings 11 that are arranged in the Y direction and extend in the X direction.

An XY cross section exemplified in FIG. 8 includes portions of the plurality of the global bit lines GBL and portions of the plurality of the wirings 11.

A plurality of the wirings 11 are provided correspondingly to a plurality of the semiconductor sections 120 arranged in the Y direction, and the wirings 11 are each connected to a plurality of the semiconductor sections 120 arranged in the X direction, for example. Moreover, the plurality of wirings 11 corresponding to one memory cell array MAa are commonly connected, and configure the wiring L1 described with reference to FIG. 2.

Note that the wiring L1 includes the likes of a material included in the global bit line GBL, for example. Moreover, an unillustrated insulating layer of the likes of $SiO_2$ may be provided between these wirings.

[Advantages]

In the present embodiment, the plurality of transistors TFT2 configuring the transistor array TAa2 are provided in a region directly above the contacts CC. Due to such a configuration, there is no need for the transistor array TAa2 to be provided on a surface of the substrate S. It is therefore possible to achieve a reduction in circuit area.

Moreover, in the present embodiment, the transistor TFT1 by which the local bit line LBL is electrically conducted with the global bit line GBL selectively, and the transistor TFT2 by which the word line WL is electrically conducted with the wiring L1 selectively, are included in the same transistor layer TLa. Such a configuration makes it possible to manufacture the transistor TFT1 and the transistor TFT2 in common manufacturing processes, and makes it possible to achieve suppression of manufacturing costs.

Now, such transistors TFT1, TFT2 sometimes have a withstand voltage which is smaller compared to that of a transistor provided on the substrate S. For example, in a so-called flash memory, a voltage of about 25 V is sometimes supplied to wirings in memory cell array during a write operation or an erase operation, and control by the transistors TFT1, TFT2 is sometimes difficult. Accordingly, in the present embodiment, the variable resistance film VR including the likes of a metal oxide film is employed as the memory cell MC. In such a configuration, it is sometimes possible for a setting operation and a resetting operation to be achieved by a voltage of about 5 V, and it is possible for control by the transistors TFT1, TFT2 to be comparatively easily achieved.

Moreover, in the present embodiment, a plurality of the semiconductor sections 120 are connected in parallel between one contact CC and one wiring L1, and these plurality of semiconductor sections 120 respectively function as channel regions of the transistors TFT2. Such a configuration makes it possible to increase a current supplied to the word line WL, and to achieve speeding up of the semiconductor memory device.

Moreover, in the present embodiment, the contact CC is connected to a substantially rectangular shaped connecting section cp2, and a plurality of the semiconductor sections 120 are provided on an upper surface of this connecting section cp2. Such a configuration makes it possible to suitably adjust placement of the semiconductor sections 120.

Second Embodiment

[Circuit Configuration]

Figure 11:
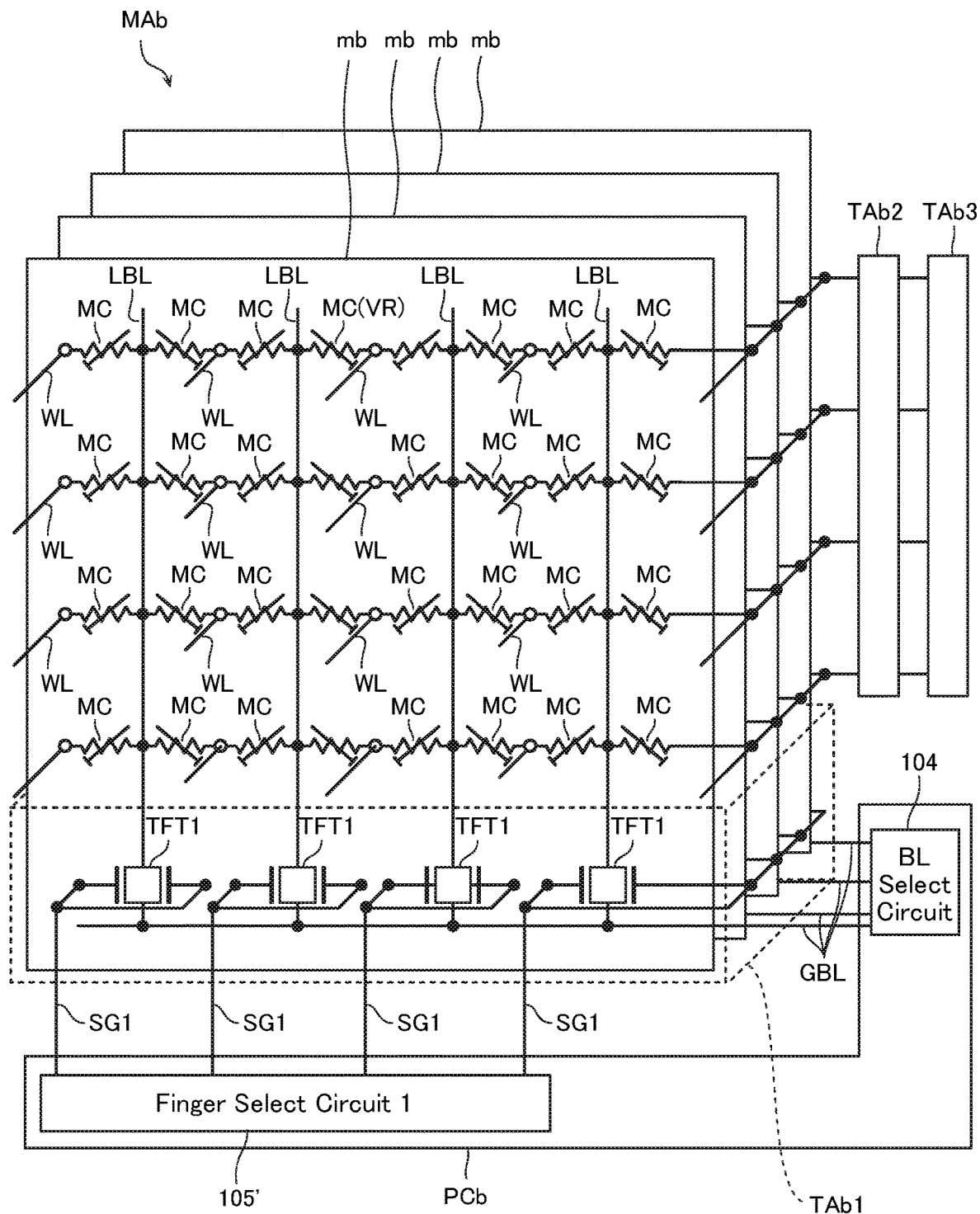
FIG. 11 is a schematic circuit diagram showing a configuration of part of a semiconductor memory device according to a second embodiment.
Figure 12:
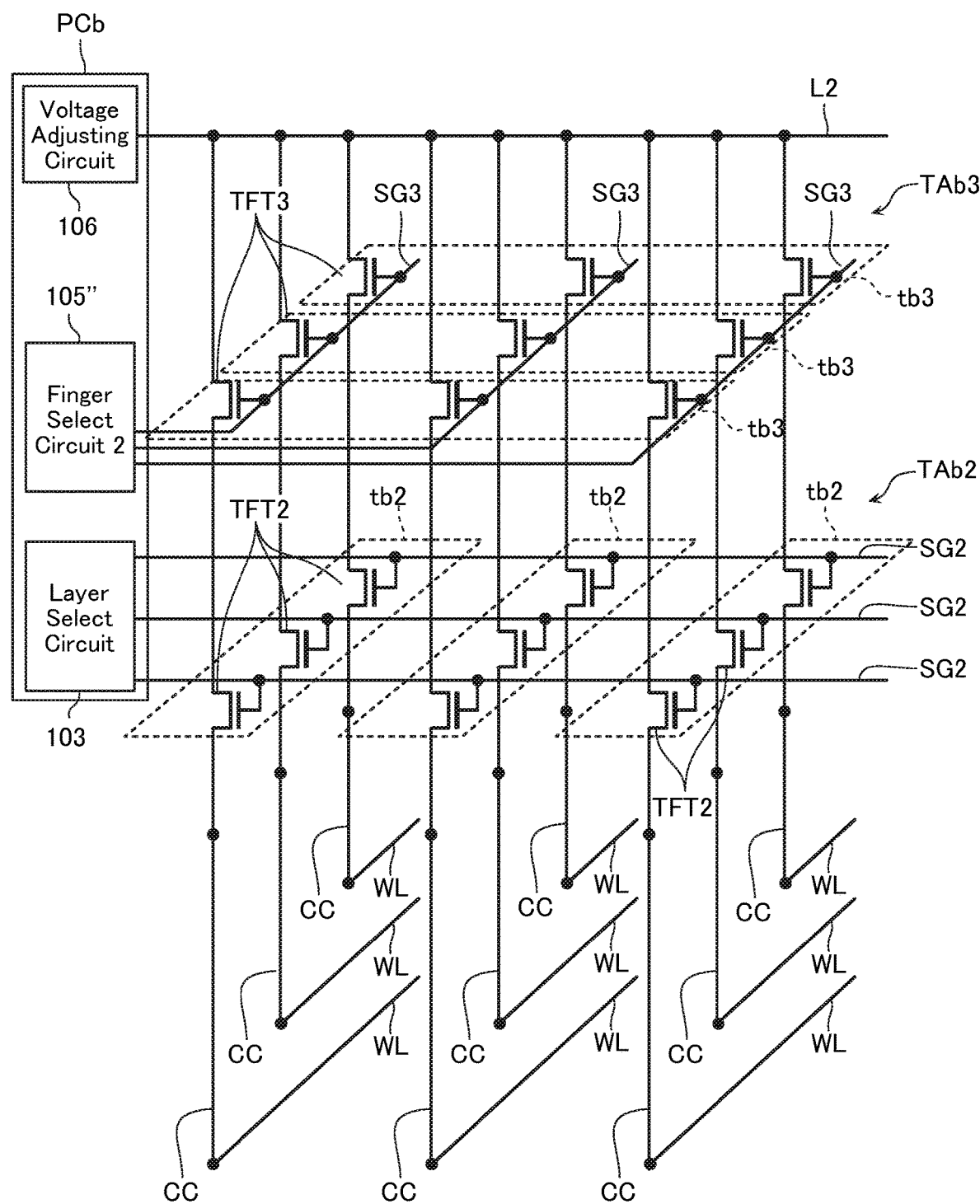
FIG. 12 is a schematic circuit diagram showing a configuration of part of same semiconductor memory device.

Next, a circuit configuration of a semiconductor memory device according to a second embodiment will be described with reference to FIGS. 11 and 12. FIGS. 11 and 12 are schematic circuit diagrams of the semiconductor memory device according to the second embodiment.

As shown in FIG. 11, for example, the semiconductor memory device according to the present embodiment includes: a memory cell array MAb that stores data; transistor arrays TAb1, TAb2 connected to the memory cell array MAb; a transistor array TAb3 connected to the transistor array TAb2; and a peripheral circuit PCb that controls these.

FIG. 11 illustrates a plurality of circuit elements mb. These plurality of circuit elements mb each include: part of a configuration of the memory cell array MAb; part of a configuration of the transistor array TAb1; and the global bit line GBL.

The circuit element mb is basically configured similarly to the circuit element ma described with reference to FIG. 1. However, the semiconductor memory device according to the present embodiment does not include the wiring CMB.

As exemplified in FIG. 12, for example, the transistor array TAb2 includes a plurality of circuit elements tb2 provided correspondingly to the select gate lines SG1. The circuit element tb2 includes: a plurality of the transistors TFT2 respectively connected to a plurality of the word lines WL; and a plurality of the select gate lines SG2 provided correspondingly to these plurality of transistors TFT2. The plurality of select gate lines SG2 are each connected to all of the circuit elements tb2.

The transistor array TAb3 includes a plurality of circuit elements tb3 provided correspondingly to the select gate lines SG2. The circuit element tb3 includes: a plurality of transistors TFT3 respectively connected to the plurality of transistors TFT2; and a plurality of select gate lines SG3 provided correspondingly to these plurality of transistors TFT3. The transistor TFT3 is a field effect type of transistor. The plurality of select gate lines SG3 are each connected to all of the circuit elements tb3. Moreover, in the illustrated example, source electrodes of the plurality of transistors TFT3 are commonly connected to a wiring L2.

Moreover, the peripheral circuit PCb includes: the layer select circuit 103 (FIG. 12); the bit line select circuit 104 (FIG. 11); a finger select circuit 105' (FIG. 11); and a finger select circuit 105" (FIG. 12).

As shown in FIG. 11, the finger select circuit 105' is connected to the select gate lines SG1. The finger select circuit 105' is configured similarly to the finger select circuit 105 described with reference to FIG. 1.

As shown in FIG. 12, the finger select circuit 105" is connected to the select gate lines SG3. The finger select circuit 105" selects one select gate line SG3 from the plurality of select gate lines SG3 according to address data, and electrically conducts the selected select gate line SG3 with a certain voltage supply line. Note that the finger select circuit 105" may electrically conduct the other select gate lines SG3 with another voltage supply line, or may make the other select gate lines SG3 in a floating state.

In addition, the peripheral circuit PCb includes the likes of a voltage adjusting circuit, a sense amplifier circuit, and a sequencer controlling these. As exemplified in FIG. 12, a voltage adjusting circuit 106 is connected to the wiring L2.

Configuration Example

Figure 13:
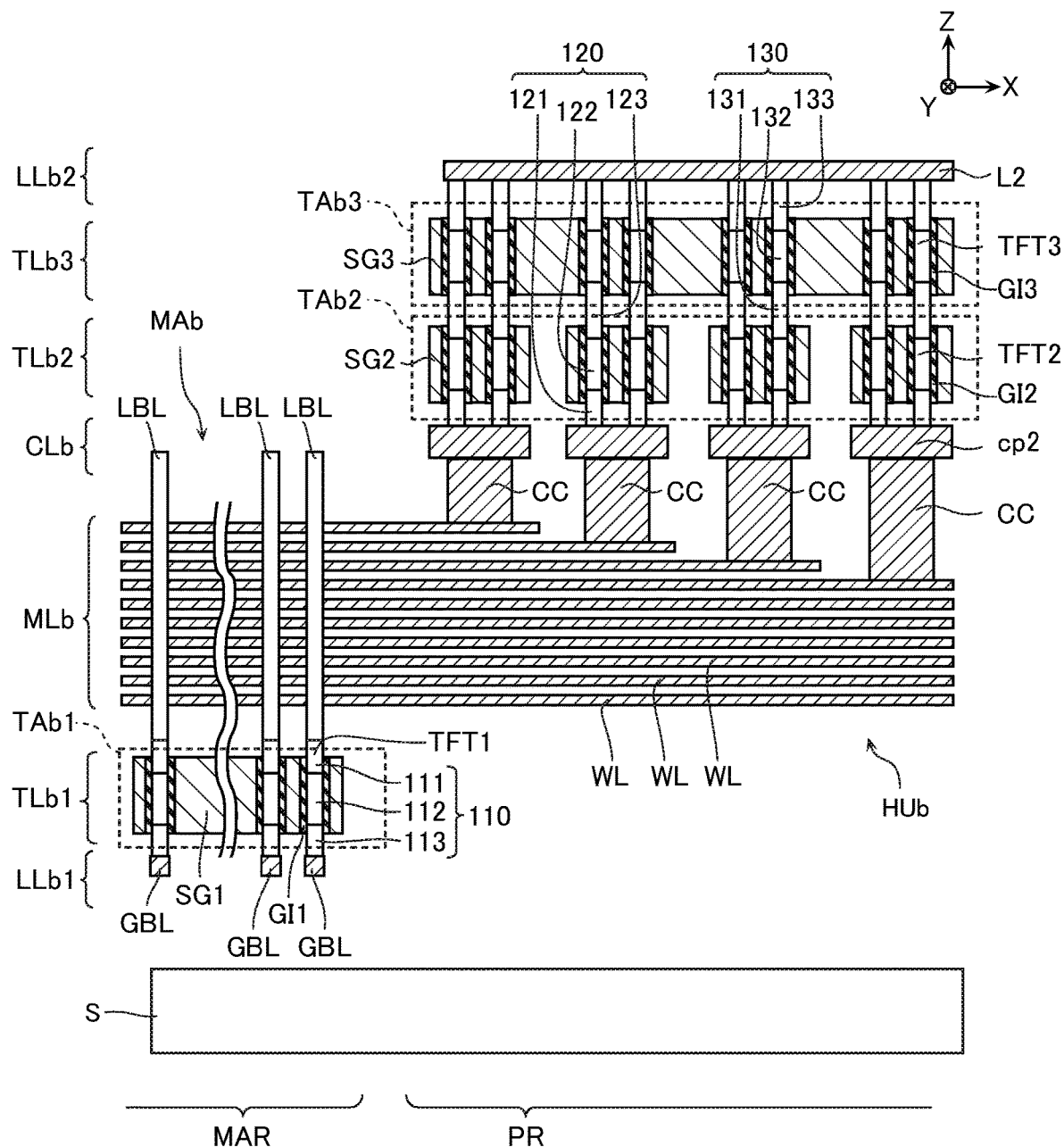
FIG. 13 is a schematic view showing a configuration example of same semiconductor memory device.

Next, a configuration example of the semiconductor memory device according to the present embodiment will be described with reference to FIG. 13. FIG. 13 is a schematic view showing the configuration example of the semiconductor memory device according to the present embodiment.

Note that in the description below, a region where the memory cell array MAb is provided will sometimes be called the memory cell array region MAR. Moreover, a region on an outer side of the memory cell array region MAR will sometimes be called the peripheral region PR.

As shown in FIG. 13, the semiconductor memory device according to the present embodiment includes: a wiring layer LLb1 provided above the substrate S; a transistor layer TLb1 provided above the wiring layer LLb1; a memory layer MLb provided above the transistor layer TLb1; a connection layer CLb provided above the memory layer MLb; a transistor layer TLb2 provided above the connection layer CLb; a transistor layer TLb3 provided above the transistor layer TLb2; and a wiring layer LLb2 provided above the transistor layer TLb3.

The wiring layer LLb1 includes the global bit lines GBL provided in the memory cell array region MAR.

The transistor layer TLb1 includes the transistor array TAb1 provided in the memory cell array region MAR.

The memory layer MLb includes: the memory cell array MAb provided in the memory cell array region MAR; and a hookup HUb provided in the peripheral region PR.

The connection layer CLb includes the plurality of connecting sections cp2 connecting the hookup HUb and the transistor array TAb2.

The transistor layer TLb2 includes the transistor array TAb2 provided in the peripheral region PR.

The transistor layer TLb3 includes the transistor array TAb3 provided in the peripheral region PR.

The wiring layer LLb2 includes the wiring L2 provided in the peripheral region PR.

[Transistor Array TAb1]

Figure 14:
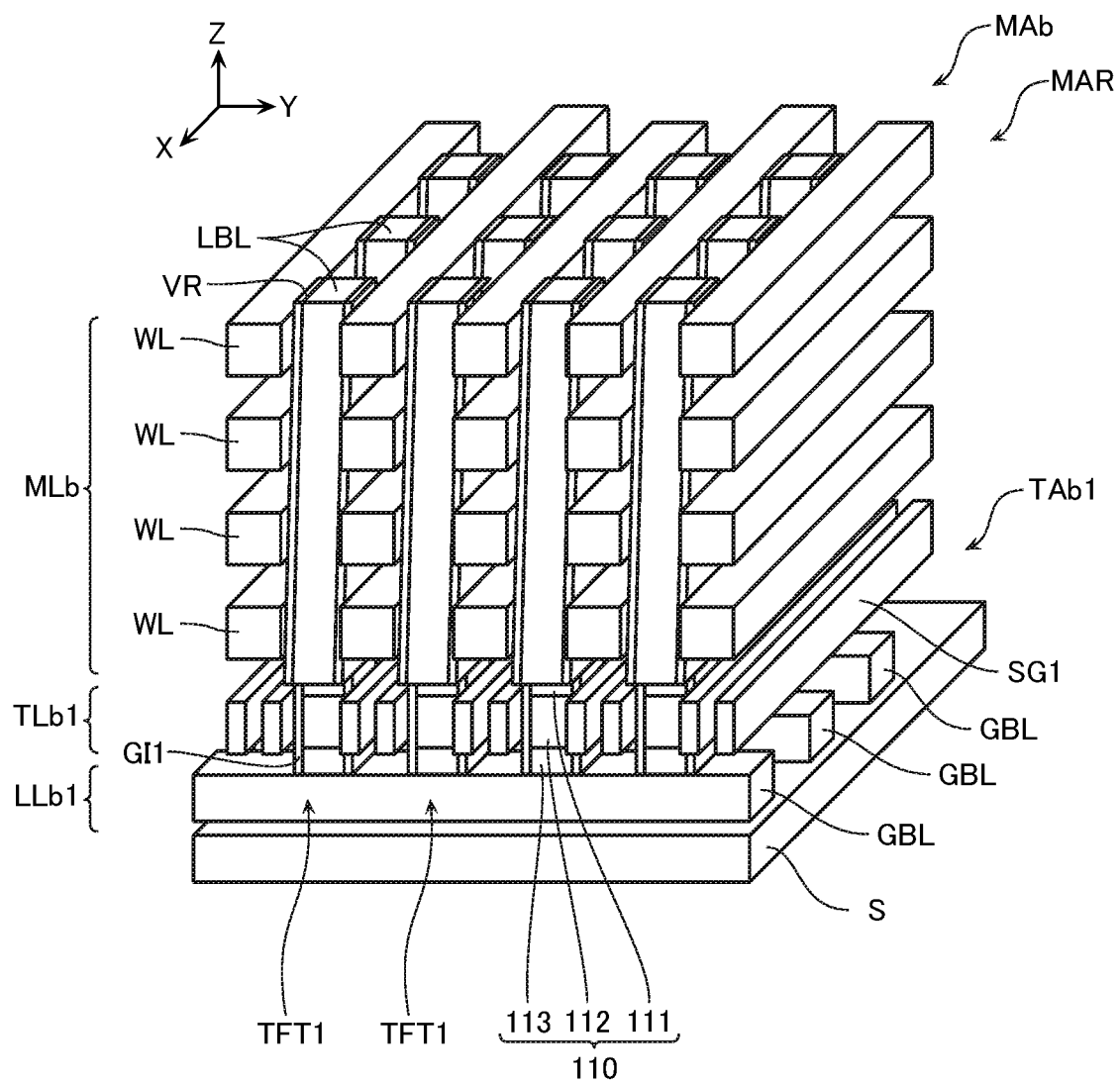
FIG. 14 is a schematic perspective view showing a configuration of part of same configuration example.

FIG. 14 is a schematic perspective view showing part of the semiconductor memory device according to the present embodiment.

As shown in FIG. 14, the transistor array TAb1 according to the present embodiment has an upside down configuration compared to the transistor array TAa1 described with reference to FIG. 5. In other respects, the transistor array TAb1 is configured similarly to the transistor array TAa1.

[Memory Cell Array MAb]

As shown in FIG. 14, the memory cell array MAb according to the present embodiment differs from the memory cell array MAa described with reference to FIG. 5 in not including the wiring CMB. In other respects, the memory cell array MAb according to the present embodiment is configured similarly to the memory cell array MAa.

[Hookup HUb]

As exemplified in FIG. 13, the hookup HUb includes: end sections of a plurality of the word lines WL laminated in the Z direction; and a plurality of the contacts CC that extend in the Z direction and are connected to these end sections of the plurality of word lines WL.

Figure 15:
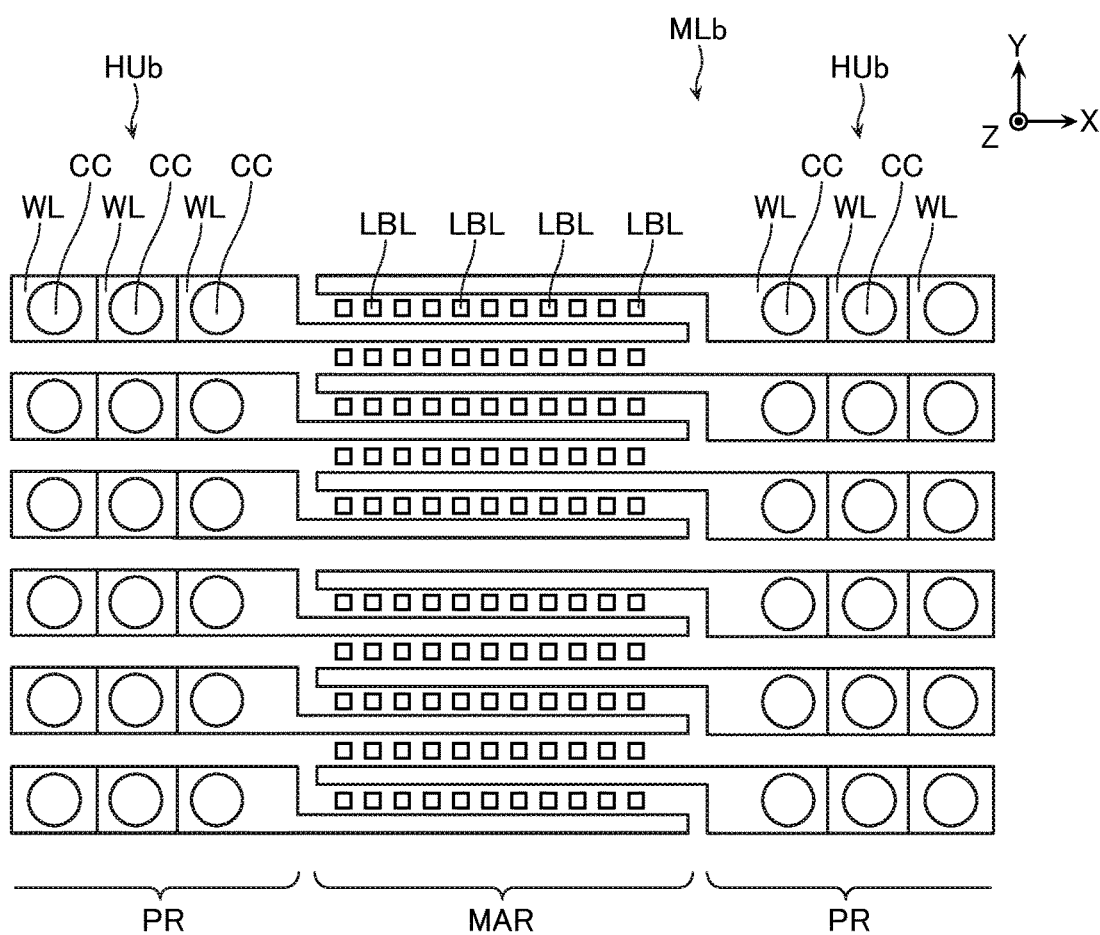
FIG. 15 is a schematic plan view showing a configuration of part of same configuration example.

As exemplified in FIG. 15, the word lines WL according to the present embodiment are each formed as an electrically independent configuration. In the example of FIG. 15, a width in the Y direction of one end section of the word line WL is formed larger than a width in the Y direction of another portion of the word line WL.

The plurality of contacts CC are provided correspondingly to the plurality of word lines WL laminated in the Z direction. Placement, and so on, of the contact CC may be appropriately changed in the present embodiment too. In the example of FIG. 15, a plurality of the contacts CC are arranged in one column in the X direction, correspondingly to the plurality of word lines WL laminated in the Z direction.

[Transistor Array TAb2]

Figure 16:
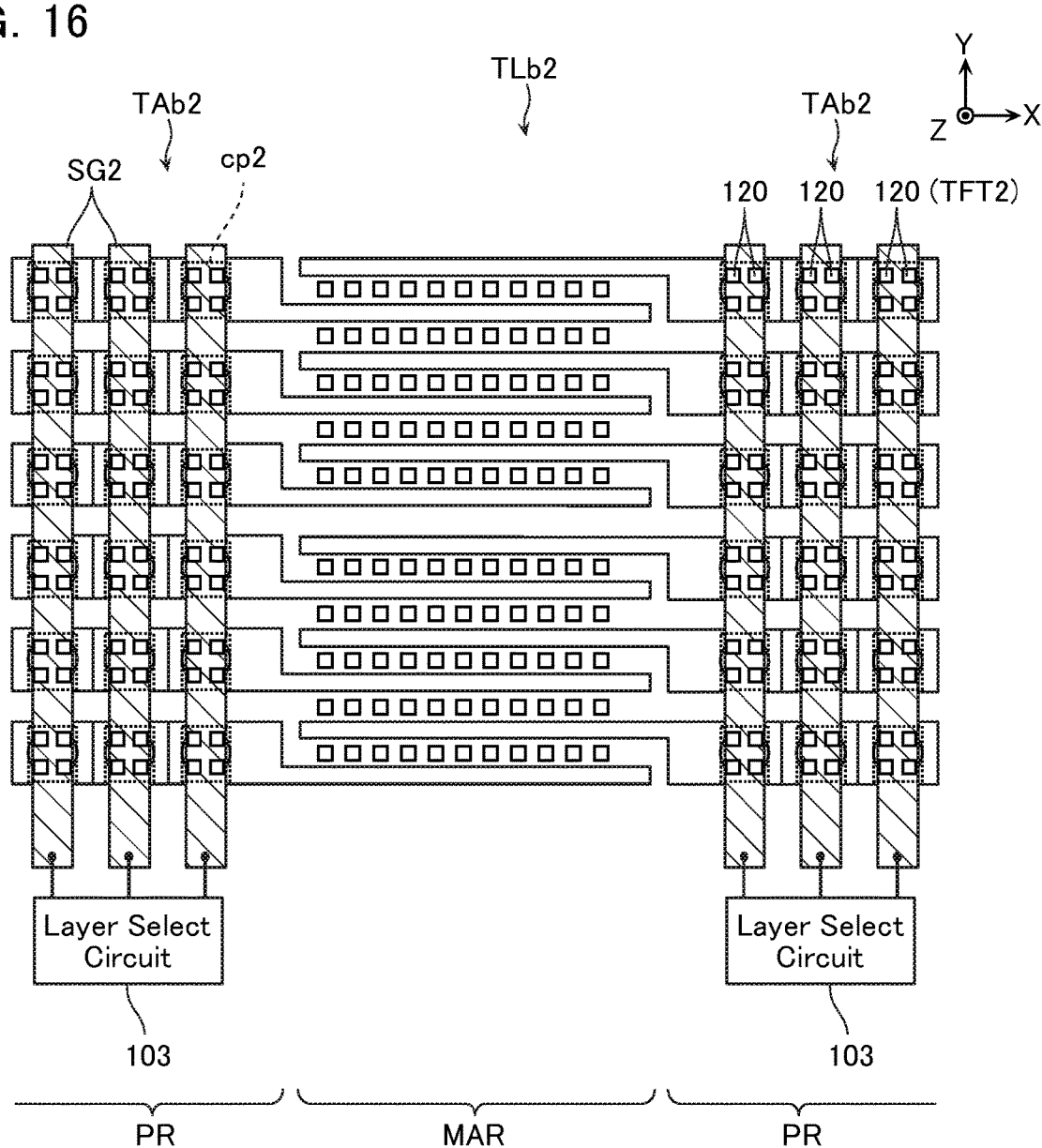
FIG. 16 is a schematic plan view showing a configuration of part of same configuration example.

As exemplified in FIG. 16, for example, the transistor array TAb2 includes: a plurality of the transistors TFT2; and a plurality of the select gate lines SG2. The transistor TFT2 and the select gate line SG2 are respectively configured substantially similarly to the transistor TFT2 and the select gate line SG2 described with reference to FIG. 4, and so on.

An XY cross section exemplified in FIG. 16 includes portions of the semiconductor sections 120 of the plurality of the transistors TFT2, portions of the select gate lines SG2, and portions of gate insulating films GI2 (FIG. 13) provided between them.

Note that, as exemplified in FIG. 16, for example, one select gate line SG2 according to the present embodiment is provided correspondingly to a plurality of the contacts CC aligned in the Y direction. Moreover, a plurality of the semiconductor sections 120 are arranged in the X direction and the Y direction in a region where the connecting sections cp2 and the select gate lines SG2 corresponding to one contact CC overlap, when viewed from the Z direction. An arrangement cycle in the X direction and the Y direction of the semiconductor sections 120 in this region may be of the same as an arrangement cycle in the X direction of the plurality of semiconductor sections 110 provided in the memory cell array region MAR, for example.

[Transistor Array TAb3]

Figure 17:
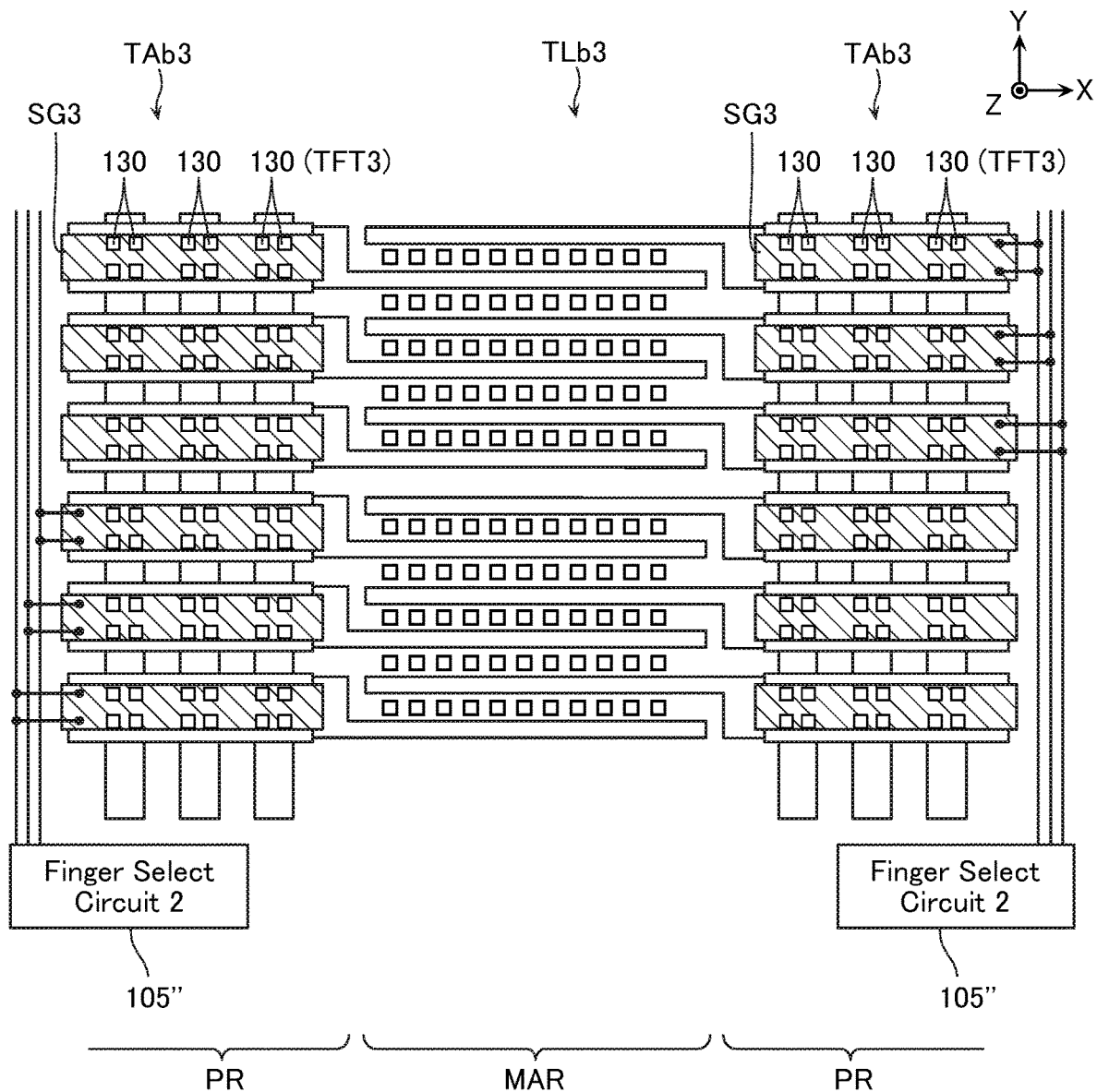
FIG. 17 is a schematic plan view showing a configuration of part of same configuration example.

As exemplified in FIG. 17, for example, the transistor array TAb3 includes: a plurality of the transistors TFT3; and a plurality of the select gate lines SG3.

An XY cross section exemplified in FIG. 17 includes portions of semiconductor sections 130 of the plurality of the transistors TFT3, portions of the select gate lines SG3, and portions of gate insulating films G13 (FIG. 13) provided between them.

A plurality of the transistors TFT3 are arranged in the X direction and the Y direction correspondingly to the transistors TFT2, and the transistors TFT3 are respectively connected to the transistors TFT2. As exemplified in FIG. 13, for example, the transistor TFT3 includes: a semiconductor section 130; a gate insulating film G13 of the likes of $SiO_2$, provided between the semiconductor section 130 and the select gate line SG3; and part of the select gate line SG3. The semiconductor section 130 includes the likes of polycrystalline silicon (Si), for example. Moreover, the semiconductor section 130 includes: an n type impurity region 131; a p type impurity region 132 provided above the n type impurity region 131; and an n type impurity region 133 provided above the p type impurity region 132.

Note that in the present embodiment, the n type impurity region 131 of the semiconductor section 130 is connected to the n type impurity region 123 of the semiconductor section 120. However, for example, the n type impurity region 131 of the semiconductor section 130 and the n type impurity region 123 of the semiconductor section 120 may be omitted, and the p type impurity region 132 of the semiconductor section 130 may be connected to the p type impurity region 122 of the semiconductor section 120. Moreover, an electrode, or the like, may be provided between the n type impurity region 131 of the semiconductor section 130 and the n type impurity region 123 of the semiconductor section 120.

As exemplified in FIG. 17, for example, a plurality of the select gate lines SG3, each extending in the X direction, are arranged in the Y direction correspondingly to the word lines WL. The select gate line SG3 faces the p type impurity region 132 of the semiconductor section 130. Moreover, the select gate line SG3 faces side surfaces of a plurality of the semiconductor sections 130 arranged in the X direction and the Y direction. As a result, the select gate line SG3 functions as a common gate electrode of a plurality of the transistors TFT3. A shape, and so on, of the select gate line SG3 may be appropriately adjusted. The select gate line SG3 may have a plurality of through-holes respectively facing outer peripheral surfaces of a plurality of the semiconductor sections 130. Moreover, the select gate line SG3 may include a plurality of wiring members respectively facing side surfaces on one side and the other side in the Y direction of the semiconductor section 130.

[Wiring L2]

Figure 18:
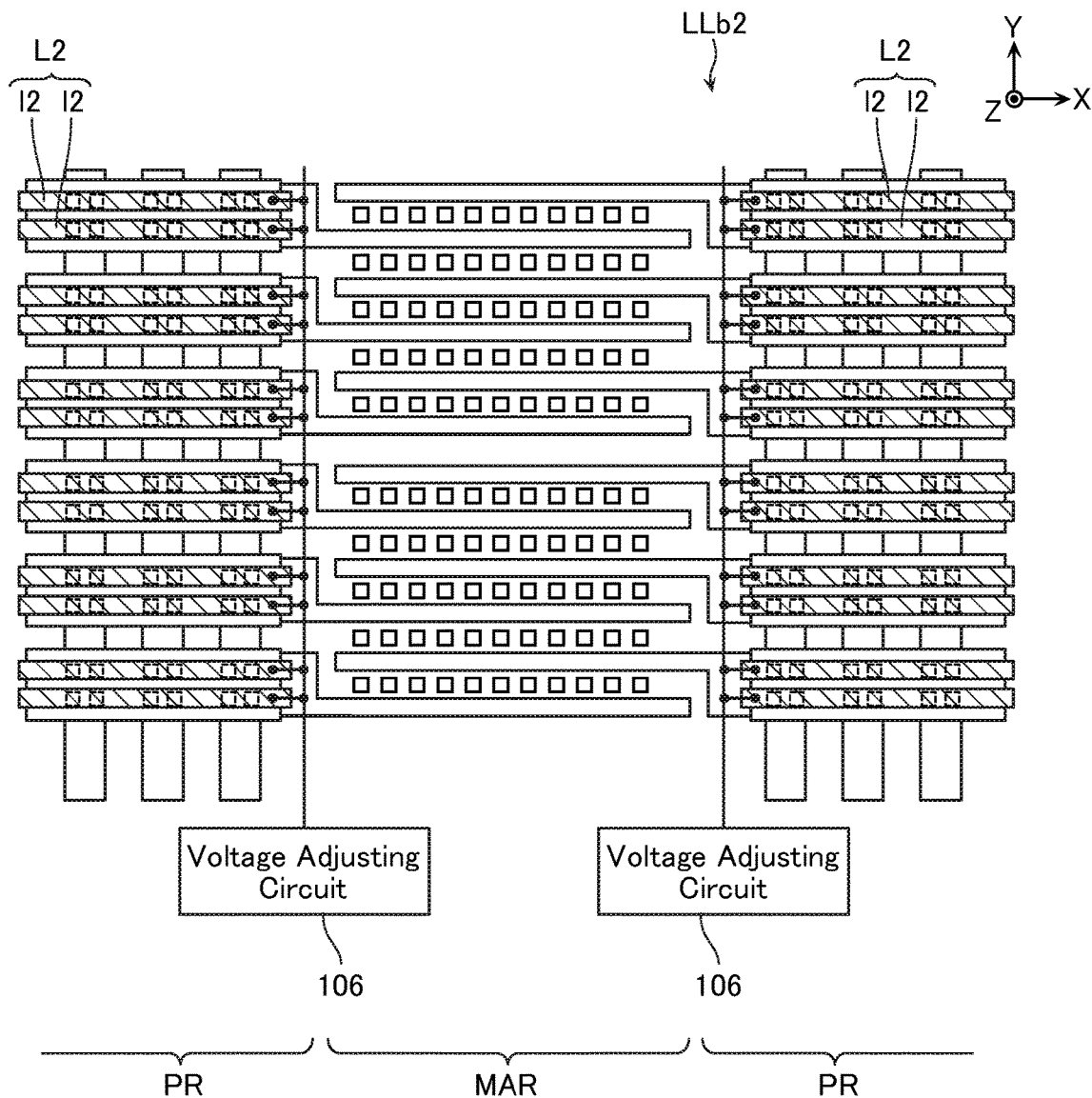
FIG. 18 is a schematic plan view showing a configuration of part of same configuration example.

As exemplified in FIG. 18, for example, the wiring L2 includes a plurality of wirings 12 that are arranged in the Y direction and extend in the X direction.

An XY cross section exemplified in FIG. 18 includes portions of the plurality of the wirings 12.

A plurality of the wirings 12 are provided correspondingly to a plurality of the semiconductor sections 130 arranged in the Y direction, and the wirings 12 are each connected to a plurality of the semiconductor sections 130 arranged in the X direction, for example. Moreover, a plurality of the wirings 12 arranged in the Y direction are commonly connected, and configure the wiring L2 described with reference to FIG. 12.

[Advantages]

As described with reference to FIG. 6, and so on, in the first embodiment, a plurality of the word lines WL aligned in the Y direction were connected to a common wiring CMB. In such a configuration, sometimes, a comparatively large voltage (or small voltage) ends up being supplied to an unintended word line WL, and a leak current ends up increasing. This sometimes ends up leading to an increase in electric power consumption.

Accordingly, in the present embodiment, as described with reference to FIG. 15, and so on, the plurality of word lines WL aligned in the Y direction are each configured as an electrically independent structure. This makes it possible to suppress the leak current. However, in such a structure, an area needed for the contacts, wirings, transistors, and so on, required in selection of the word line WL, and so on, sometimes ends up increasing.

Accordingly, in the present embodiment, as described with reference to FIG. 13, and so on, two transistor arrays TAb2, TAb3 are provided directly above the hookup HUb, thereby enabling a voltage to be selectively supplied to a desired word line WL. Such a configuration makes it possible for a significant reduction in circuit area to be achieved.

Third Embodiment

Figure 19:
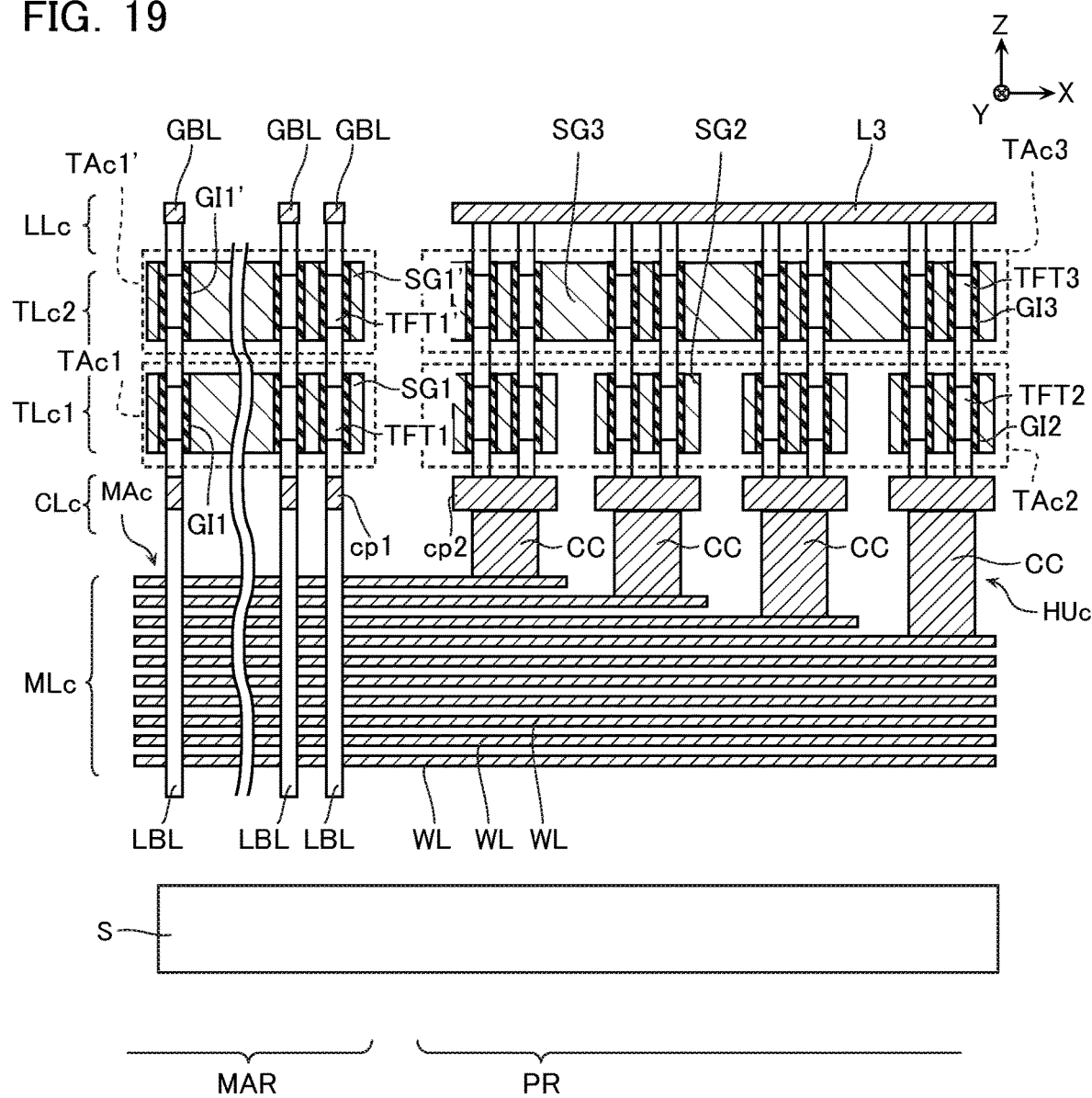
FIG. 19 is a schematic view showing a configuration example of a semiconductor memory device according to a third embodiment.

Next, a semiconductor memory device according to a third embodiment will be described with reference to FIG. 19. FIG. 19 is a schematic view showing a configuration example of the semiconductor memory device according to the third embodiment.

Note that in the description below, a region where a memory cell array MAc is provided will sometimes be called the memory cell array region MAR. Moreover, a region on an outer side of the memory cell array region MAR will sometimes be called the peripheral region PR.

The semiconductor memory device according to the present embodiment includes: a memory layer MLc provided above the substrate S; a connection layer CLc provided above the memory layer MLc; a transistor layer TLc1 provided above the connection layer CLc; a transistor layer TLc2 provided above the transistor layer TLc1; and a wiring layer LLc provided above the transistor layer TLc2.

The memory layer MLc includes: the memory cell array MAc provided in the memory cell array region MAR; and a hookup HUc provided in the peripheral region PR. The memory cell array MAc and the hookup HUc are respectively configured similarly to the memory cell array MAb and the hookup HUb described with reference to FIGS. 13-15.

The connection layer CLc includes: a plurality of the connecting sections cp1 that connect the memory cell array MAc and a transistor array TAc1; and a plurality of the connecting sections cp2 that connect the hookup HUc and a transistor array TAc2. The connecting section cp1 is configured similarly to the connecting section cp1 according to the first embodiment. The connecting section cp2 is configured similarly to the connecting section cp2 according to the second embodiment.

Figure 20:
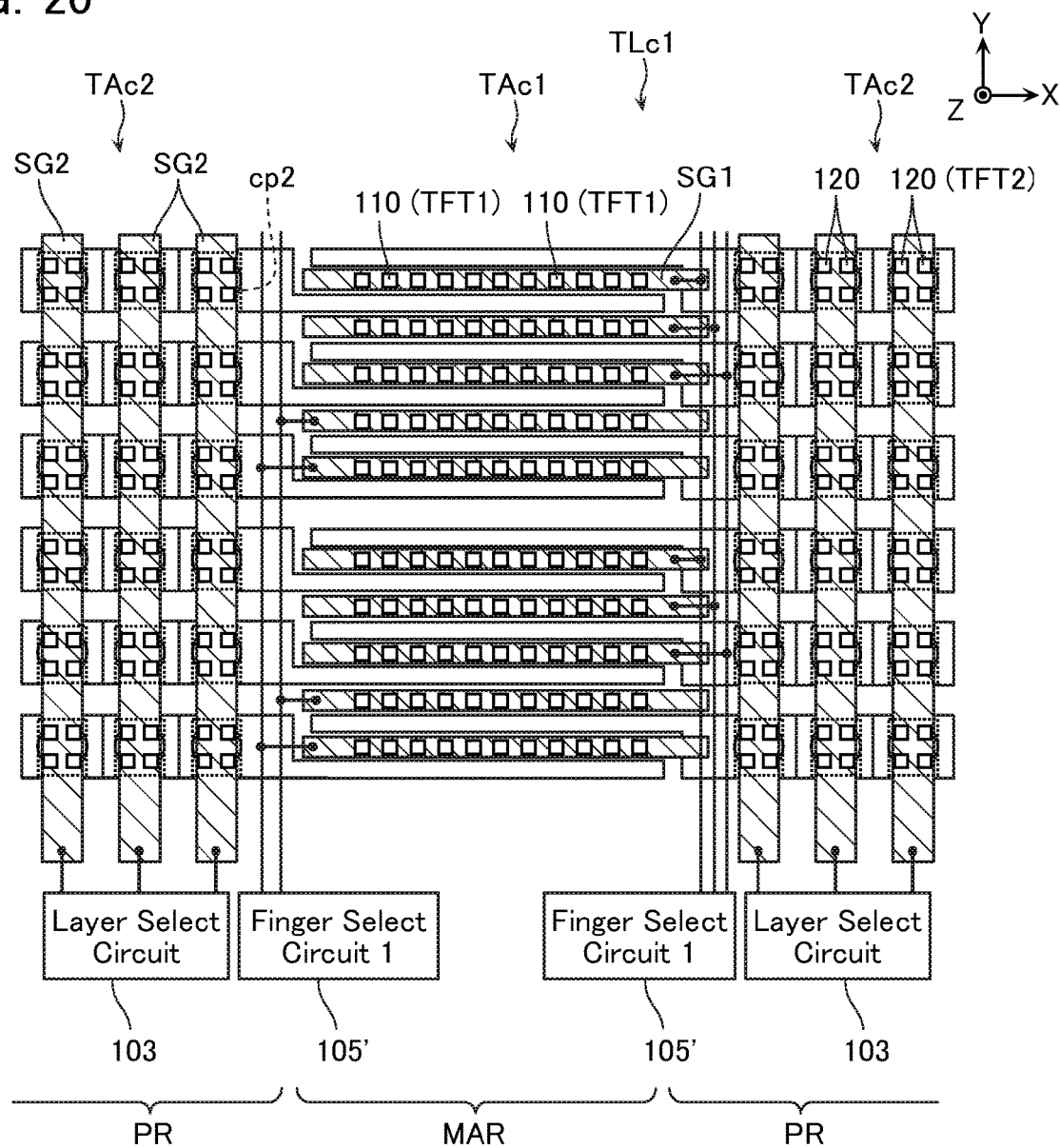
FIG. 20 is a schematic plan view showing a configuration of part of same configuration example.

The transistor layer TLc1 includes: the transistor array TAc1 provided in the memory cell array region MAR; and the transistor array TAc2 provided in the peripheral region PR. As exemplified in FIG. 20, the transistor array TAc1 and the transistor array TAc2 are configured similarly to the transistor array TAa1 and the transistor array TAa2 described with reference to FIGS. 5, 7, and so on. An XY cross section exemplified in FIG. 20 includes portions of configurations (110, SG1, GI1) of the transistor array TAc1 and portions of configurations (120, SG2, GI2) of the transistor array TAc2.

As shown in FIG. 19, for example, the transistor layer TLc2 includes: a transistor array TAc1' provided in the memory cell array region MAR; and a transistor array TAc3 provided in the peripheral region PR. As exemplified in FIG. 21, the transistor array TAc1' is configured similarly to the transistor array TAa1 described with reference to FIGS. 5, 7, and so on. Moreover, the transistor array TAc3 is configured similarly to the transistor array TAb3 described with reference to FIG. 17, and so on. An XY cross section exemplified in FIG. 21 includes portions of configurations (110', SG1', GI1') of the transistor array TAc1' and portions of configurations (130, SG3, G13) of the transistor array TAc3.

Figure 22:
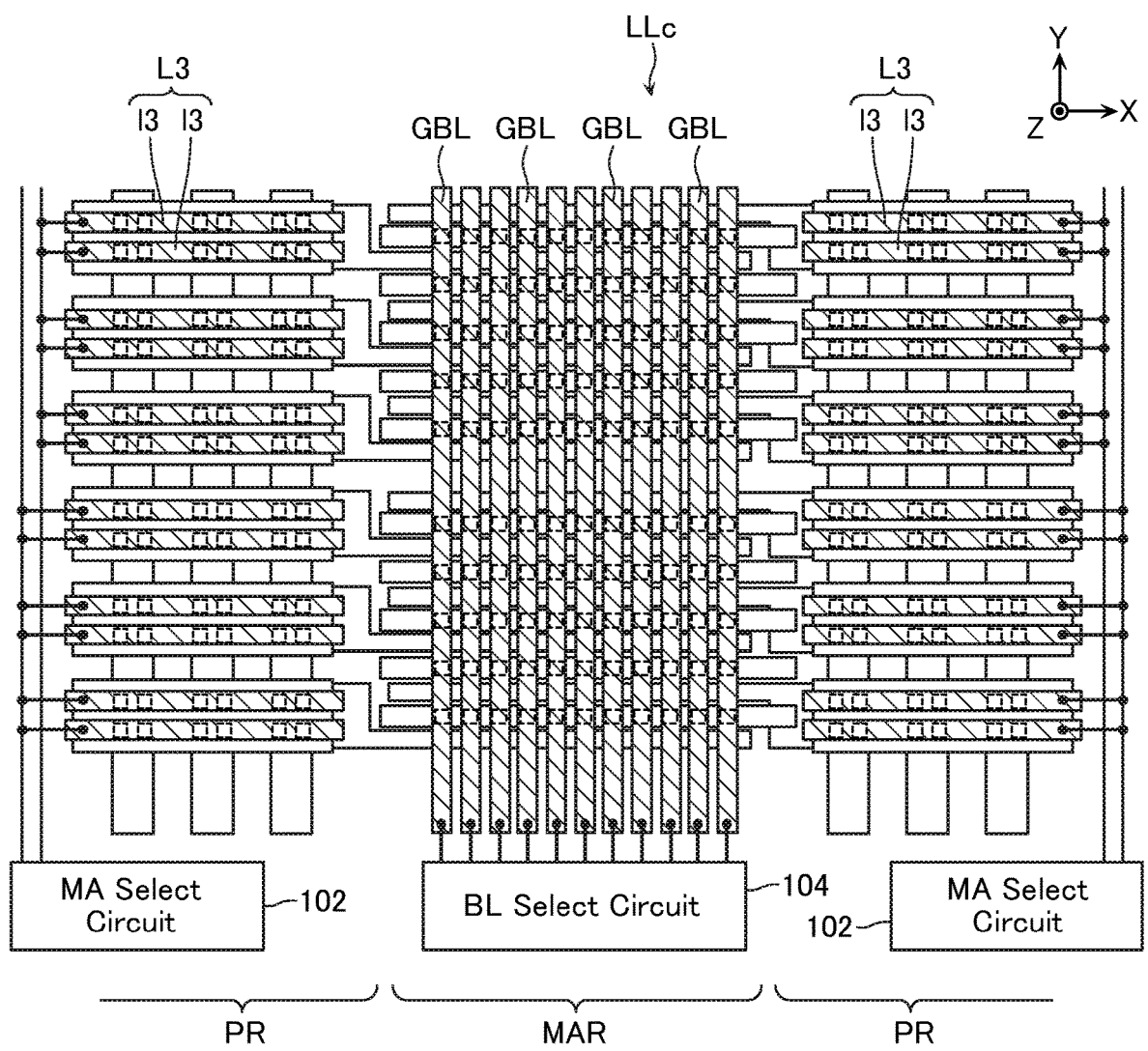
FIG. 22 is a schematic plan view showing a configuration of part of same configuration example.

As shown in FIG. 19, for example, the wiring layer LLc includes: the global bit line GBL provided in the memory cell array region MAR; and a wiring L3 provided in the peripheral region PR. As exemplified in FIG. 22, the global bit line GBL is configured similarly to the global bit line GBL described with reference to FIGS. 5, 8, and so on. Moreover, the wiring L3 is configured similarly to the wiring L2 described with reference to FIG. 18, and so on. An XY cross section exemplified in FIG. 22 includes portions of the plurality of the global bit lines GBL and portions of the plurality of the wirings 13.

[Advantages]

Such a configuration makes it possible for similar advantages to those of the first embodiment and the second embodiment to be displayed.

Other Embodiments

That concludes description of the semiconductor memory devices according to the first through third embodiments. However, the above configurations are merely exemplifications, and a specific configuration may be appropriately changed.

For example, appropriate adjustment may be made regarding what transistor and what wiring are to be employed to perform selection of memory cells MC.

For example, the semiconductor memory device according to the first embodiment makes it possible for one word line WL to be selected from a plurality of the word lines WL laminated in the Z direction by the transistor array TAa2 provided directly above the hookup HUa (refer to FIGS. 4 and 7), and for one memory cell array MAa to be selected from a plurality of the memory cell arrays MAa arranged in the Y direction by the wiring L1 provided directly above the transistor array TAa2 (refer to FIGS. 4 and 8).

However, in the first embodiment, for example, a memory cell array MAa2 may be selected by the transistor array TAa2, and one word line WL may be selected from the plurality of word lines WL laminated in the Z direction by the wiring L1.

Moreover, for example, the semiconductor memory device according to the second embodiment makes it possible for one word line WL to be selected from a plurality of the word lines WL laminated in the Z direction by the transistor array TAb2 included in the transistor layer TLb2 (refer to FIGS. 13 and 16), and for one word line WL to be selected from a plurality of the word lines WL arranged in the Y direction by the transistor array TAb3 included in the transistor layer TLb3 (refer to FIGS. 13 and 17).

Now, in the second embodiment, the transistor layer TLb2 including the transistor array TAb2 is positioned below the transistor layer TLb3 including the transistor array TAb3. However, the transistor layer TLb2 including the transistor array TAb2 may be positioned above the transistor layer TLb3 including the transistor array TAb3. Moreover, the wiring L2 (FIG. 18) may be divided into several wirings and employed in selection of the word line WL.

Figure 21:
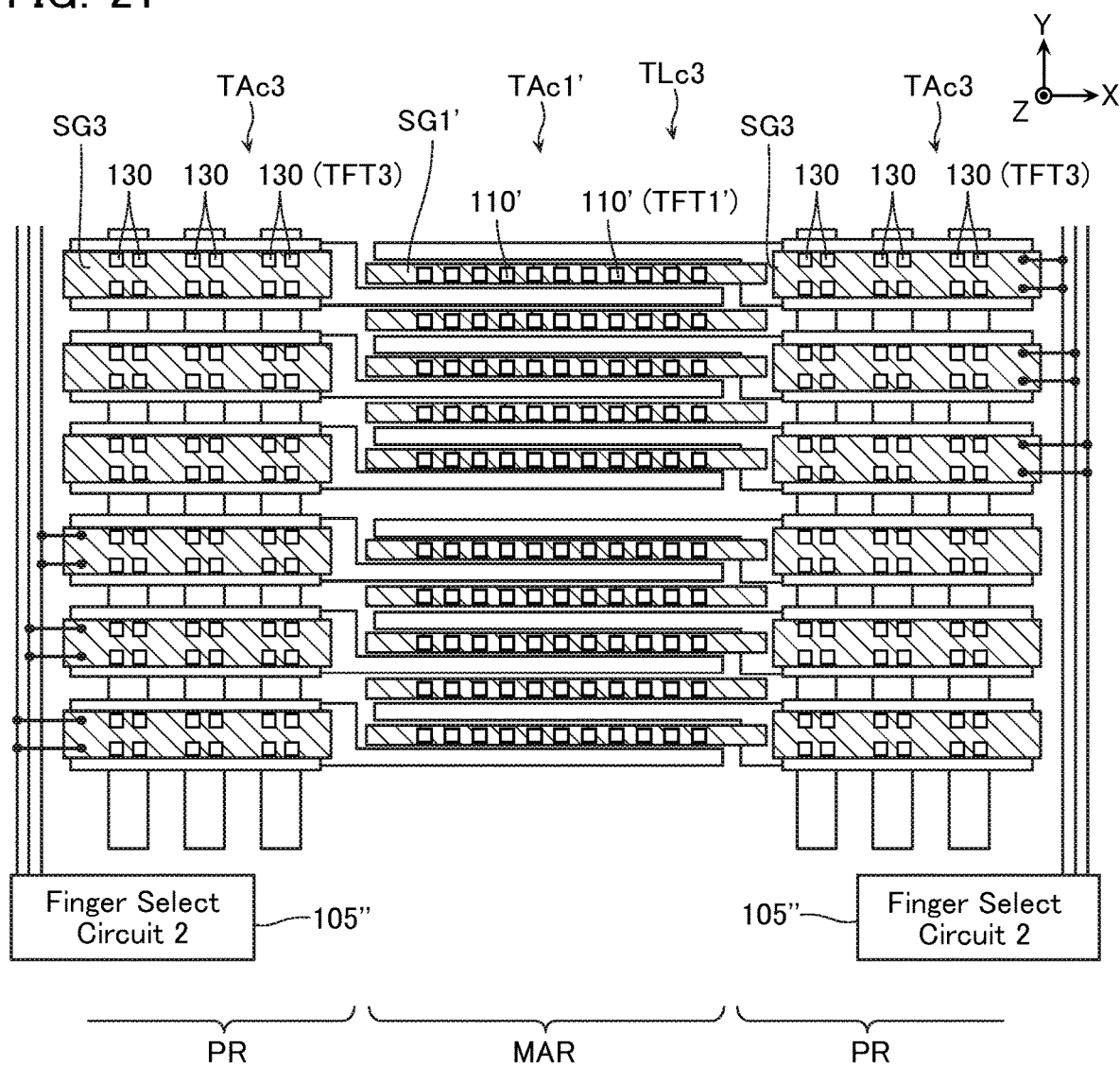
FIG. 21 is a schematic plan view showing a configuration of part of same configuration example.

Moreover, for example, the semiconductor memory device according to the third embodiment makes it possible for one word line WL to be selected from a plurality of the word lines WL laminated in the Z direction by the transistor array TAc2 included in the transistor layer TLc1 (refer to FIGS. 19 and 20), and for one word line WL to be selected from a plurality of the word lines WL arranged in the Y direction by the transistor array TAc3 included in the transistor layer TLc2 (refer to FIGS. 19 and 21).

Now, in the third embodiment, the transistor layer TLc1 including the transistor array TAc2 is positioned below the transistor layer TLc2 including the transistor array TAc3. However, the transistor layer TLc1 including the transistor array TAc2 may be positioned above the transistor layer TLc2 including the transistor array TAc3. Moreover, the wiring L3 (FIG. 22) may be divided into several wirings and employed in selection of the word line WL.

Figure 23:
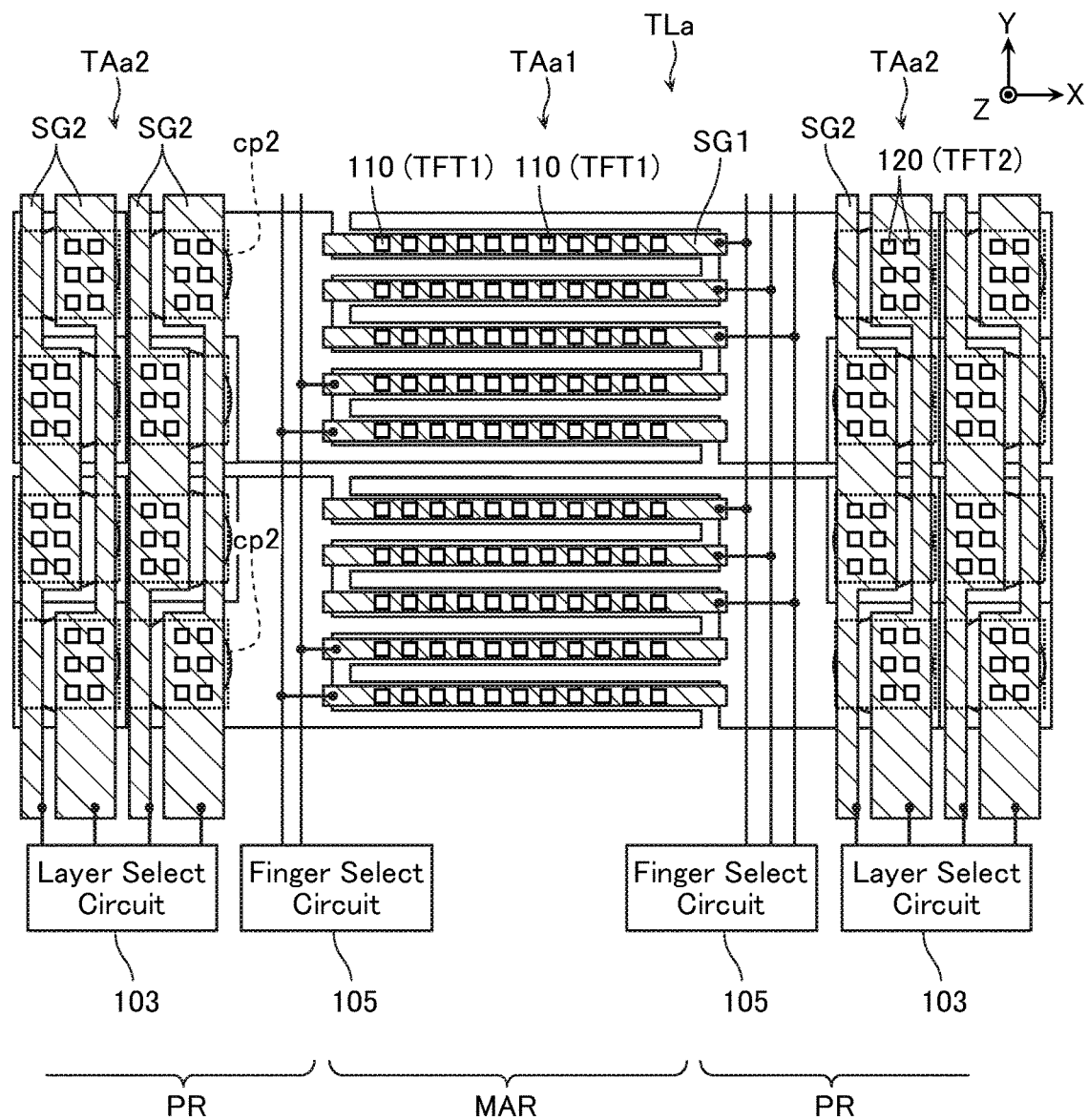
FIG. 23 is a schematic plan view showing a configuration of part of another configuration example.

Moreover, a specific shape, and so on, of each of the configurations may be appropriately adjusted. For example, in the example of FIG. 7, two select gate lines SG2 are provided correspondingly to a plurality of the contacts CC arranged in the Y direction. Moreover, a plurality of the semiconductor sections 120 are arranged in the X direction and the Y direction in a region where the connecting sections cp2 and the select gate lines SG2 corresponding to one contact CC overlap, when viewed from the Z direction. In such a case, as exemplified in FIG. 23, for example, it is possible for a shape of the select gate line SG2 to be adjusted. That is, a width in the X direction of a portion provided with the TFT2, of the select gate line SG2 is conceivably made larger than a width in the X direction of a portion not provided with the TFT2, of the select gate line SG2. It is thereby conceivable for wiring resistance to be suppressed and a current flowing between the contact CC and the wiring L1 to be increased.

[Others]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a substrate;
   a first wiring that extends in a first direction, the first direction intersecting a surface of the substrate;
   a second wiring that extends in a second direction intersecting the first direction;
   a variable resistance film provided between the first wiring and the second wiring;

a third wiring that extends in a third direction intersecting the first direction and the second direction, and is further from the substrate than the first wiring is;

a first semiconductor section that extends in the first direction and is connected to the first wiring and the third wiring;

a first gate electrode facing the first semiconductor section;

a first gate insulating film provided between the first semiconductor section and the first gate electrode;

a contact that extends in the first direction and is connected to the second wiring;

a fourth wiring that is further from the substrate than the contact is;

a second semiconductor section that extends in the first direction and is connected to the contact and the fourth wiring;

a second gate electrode facing the second semiconductor section; and a second gate insulating film provided between the second semiconductor section and the second gate electrode, the first semiconductor section, the first gate electrode, the first gate insulating film, the second semiconductor section, the second gate electrode, and the second gate insulating film respectively including a portion included in a first cross section extending in the second direction and the third direction.

2. The semiconductor memory device according to claim 1, wherein
the first gate electrode extends in the second direction,
the second gate electrode extends in the third direction, and
the fourth wiring extends in the second direction.

3. The semiconductor memory device according to claim 1, comprising
a plurality of the second semiconductor sections connected in parallel between the contact and the fourth wiring, wherein
the second gate electrode faces the plurality of the second semiconductor sections.

4. The semiconductor memory device according to claim 1, wherein
the first gate electrode faces the first semiconductor section in the second direction and in the third direction, and
the second gate electrode faces the second semiconductor section in the second direction and in the third direction.

5. The semiconductor memory device according to claim 1, wherein
the first gate electrode faces the first semiconductor section in the third direction, and
the second gate electrode faces the second semiconductor section in the second direction.

6. The semiconductor memory device according to claim 1, comprising
a plurality of the first semiconductor sections arranged in the second direction at a first arrangement cycle, and
a plurality of the second semiconductor sections arranged in the second direction at a second arrangement cycle and arranged in the third direction at a third arrangement cycle, wherein
at least one of the second arrangement cycle and the third arrangement cycle is identical to the first arrangement cycle.

7. The semiconductor memory device according to claim 6, comprising:

a plurality of the first wirings arranged in the second direction;

a plurality of first conductive layers provided between the plurality of the first wirings and the plurality of the first semiconductor sections; and a second conductive layer provided between the contact and at least two of the plurality of the second semiconductor sections.

8. The semiconductor memory device according to claim 1, comprising:

a plurality of the second wirings arranged in the first direction;

a plurality of the contacts connected to the plurality of the second wirings;

a plurality of the second semiconductor sections connected to the plurality of the contacts; and a plurality of the second gate electrodes arranged in the second direction, extending in the third direction, and facing the plurality of the second semiconductor sections.

9. The semiconductor memory device according to claim 8, comprising:

a first circuit connected to the plurality of the second gate electrodes, wherein the first circuit supplies a first voltage to one of the plurality of the second gate electrodes in response to a first address signal.

10. The semiconductor memory device according to claim 1, comprising:

a plurality of the first wirings arranged in the third direction;

a plurality of the second wirings arranged in the third direction and extending in the second direction;

a plurality of the contacts connected to the plurality of the second wirings;

a plurality of the second semiconductor sections connected to the plurality of the contacts; and a plurality of the fourth wirings arranged in the third direction, extending in the second direction, and connected to the plurality of the second semiconductor sections.

11. The semiconductor memory device according to claim 10, comprising:

a second circuit connected to the plurality of the fourth wirings, wherein the second circuit supplies a second voltage to one of the plurality of the fourth wiring in response to a second address signal.

12. A semiconductor memory device comprising:
a substrate;
a first wiring that extends in a first direction intersecting a surface of the substrate;
a second wiring that extends in a second direction intersecting the first direction;
a variable resistance film provided between the first wiring and the second wiring;
a third wiring that extends in a third direction intersecting the first direction and the second direction, and is separated from the first wiring in the first direction;
a first semiconductor section that extends in the first direction and is connected to the first wiring and the third wiring;
a first gate electrode facing the first semiconductor section;
a first gate insulating film provided between the first semiconductor section and the first gate electrode;

a contact that extends in the first direction and is connected to the second wiring;
a fourth wiring that is separated from the contact in the first direction;
a second semiconductor section and a third semiconductor section that extend in the first direction and are connected in series between the contact and the fourth wiring;
a second gate electrode facing the second semiconductor section;
a second gate insulating film provided between the second semiconductor section and the second gate electrode;
a third gate electrode facing the third semiconductor section; and
a third gate insulating film provided between the third semiconductor section and the third gate electrode,
the second gate electrode extending in one of the second direction and the third direction, and
the third gate electrode extending in the other of the second direction and the third direction.

13. The semiconductor memory device according to claim 12, comprising:
a fourth semiconductor section that extends in the first direction and is connected to the third wiring and the first semiconductor section;
a fourth gate electrode facing the fourth semiconductor section; and
a fourth gate insulating film provided between the fourth semiconductor section and the fourth gate electrode,
wherein the first semiconductor section, the first gate electrode, the first gate insulating film, the second semiconductor section, the second gate electrode, and the second gate insulating film respectively include a portion included in a first cross section extending in the second direction and the third direction, and
the third semiconductor section, the third gate electrode, the third gate insulating film, the fourth semiconductor section, the fourth gate electrode, and the fourth gate insulating film respectively include a portion included in a second cross section extending in the second direction and the third direction.

14. The semiconductor memory device according to claim 12, comprising
a plurality of the second semiconductor sections and a plurality of the third semiconductor sections connected in parallel between the contact and the fourth wiring, wherein
the second gate electrode faces the plurality of the second semiconductor sections, and
the third gate electrode faces the plurality of the third semiconductor sections.

15. The semiconductor memory device according to claim 12, comprising:
a plurality of the second wirings arranged in the first direction and the third direction;
a plurality of the contacts arranged in the second direction and the third direction and connected to the plurality of the second wirings;
a plurality of the second semiconductor sections and a plurality of the third semiconductor sections arranged in the second direction and the third direction and connected to the plurality of the contacts;
a plurality of the second gate electrodes extending in the one of the second direction and the third direction, arranged in the other of the second direction and the third direction, and facing the plurality of the second semiconductor sections; and
a plurality of the third gate electrodes extending in the other of the second direction and the third direction, arranged in the one of the second direction and the third direction, and facing the plurality of the third semiconductor sections.

16. The semiconductor memory device according to claim 15, comprising:
a first circuit connected to the plurality of the second gate electrodes, and
a second circuit connected to the plurality of the third gate electrodes, wherein
the first circuit supplies a first voltage to one of the plurality of the second gate electrodes in response to a first address signal, and
the second circuit supplies a second voltage to one of the plurality of the third gate electrodes in response to a second address signal.

* * * * *